United States Patent
Honda et al.

(10) Patent No.: US 9,162,435 B2
(45) Date of Patent: Oct. 20, 2015

(54) PEEL-OFF APPARATUS, PEEL-OFF SYSTEM, PEEL-OFF METHOD AND COMPUTER STORAGE MEDIUM

(71) Applicant: Tokyo Electron Limited, Tokyo (JP)

(72) Inventors: Masaru Honda, Kumamoto (JP); Ryoichi Sakamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/492,364

(22) Filed: Sep. 22, 2014

(65) Prior Publication Data

US 2015/0101758 A1 Apr. 16, 2015

(30) Foreign Application Priority Data

Oct. 11, 2013 (JP) .................... 2013-213657

(51) Int. Cl.
*B32B 38/10* (2006.01)
*B32B 38/18* (2006.01)
*H01L 21/67* (2006.01)
*B32B 43/00* (2006.01)

(52) U.S. Cl.
CPC ............... *B32B 38/18* (2013.01); *B32B 38/10* (2013.01); *B32B 38/1858* (2013.01); *H01L 21/67092* (2013.01); *B32B 43/006* (2013.01); *B32B 2309/105* (2013.01); *B32B 2457/14* (2013.01); *Y10T 156/1132* (2015.01); *Y10T 156/1168* (2015.01); *Y10T 156/1944* (2015.01); *Y10T 156/1967* (2015.01)

(58) Field of Classification Search
CPC ...... B32B 32/10; B32B 43/006; B32B 38/10; Y10T 156/1944; Y10T 156/1967; Y10T 156/1968; Y10T 156/1132; Y10T 156/1168
See application file for complete search history.

(56) References Cited

U.S. PATENT DOCUMENTS

| | | | | |
|---|---|---|---|---|
| 5,133,824 A * | 7/1992 | Huberts et al. | ............... | 156/707 |
| 6,503,130 B2 * | 1/2003 | Lim | ............... | 451/285 |
| 6,881,135 B2 * | 4/2005 | Boo et al. | ............... | 451/285 |
| 7,187,162 B2 * | 3/2007 | Kerdiles et al. | ............ | 324/756.07 |
| 7,571,538 B2 * | 8/2009 | Teshirogi et al. | ............... | 29/729 |
| 7,757,740 B2 * | 7/2010 | Nakamura | ............... | 156/542 |
| 8,465,011 B2 * | 6/2013 | Segawa et al. | ............... | 269/21 |
| 8,470,129 B1 * | 6/2013 | Wang | ............... | 156/705 |
| 2004/0118515 A1 * | 6/2004 | Huang et al. | ............... | 156/344 |
| 2009/0139662 A1 * | 6/2009 | Nakamura et al. | ............ | 156/584 |
| 2009/0279995 A1 * | 11/2009 | Haji et al. | ............... | 414/752.1 |

(Continued)

FOREIGN PATENT DOCUMENTS

JP 2013-149655 A 8/2013

*Primary Examiner* — Mark A Osele
*Assistant Examiner* — Nickolas Harm
(74) *Attorney, Agent, or Firm* — Abelman, Frayne & Schwab

(57) ABSTRACT

Disclosed is a peel-off apparatus comprising: a first holding unit configured to hold a first substrate of a superimposed substrate; a second holding unit configured to hold a second substrate of the superimposed substrate; and a moving unit configured to move a part of outer periphery of the first holding unit to be separated from the second holding unit. The first holding unit includes: a plate type elastic member connected to the moving unit; and a plurality of adsorbing units provided in the elastic member to adsorb the first substrate. An outer periphery adsorbing unit which becomes a peel-off beginning point includes: a pad member whose adsorbing surface of the first substrate is open to form a hollow portion; and a support member fitted into the hollow portion of the pad member having a hardness higher than that of the pad member.

10 Claims, 14 Drawing Sheets

(56) References Cited

U.S. PATENT DOCUMENTS

| | | | |
|---|---|---|---|
| 2010/0000680 A1* | 1/2010 | Inao et al. | 156/344 |
| 2011/0297329 A1* | 12/2011 | Canale et al. | 156/756 |
| 2012/0080150 A1* | 4/2012 | Riege et al. | 156/752 |
| 2012/0168091 A1* | 7/2012 | Kell et al. | 156/707 |
| 2013/0048224 A1* | 2/2013 | George et al. | 156/752 |
| 2013/0146228 A1* | 6/2013 | Hirakawa et al. | 156/701 |

\* cited by examiner

PEEL-OFF APPARATUS, PEEL-OFF SYSTEM, PEEL-OFF METHOD AND COMPUTER STORAGE MEDIUM

CROSS-REFERENCE TO RELATED APPLICATIONS

This application is based on and claims priority from Japanese Patent Application No. 2013-213657, filed on Oct. 11, 2013, with the Japan Patent Office, the disclosure of which is incorporated herein in its entirety by reference.

TECHNICAL FIELD

The present disclosure relates to a peel-off apparatus which peels off a superimposed substrate into a first substrate and a second substrate, a peel-off system including the peel-off apparatus, a peel-off method using the peel-off apparatus, a program, and a computer storage medium.

BACKGROUND

In a manufacturing process of a semiconductor device, the diameter of a semiconductor substrate such as a silicon wafer or a compound semiconductor wafer has been increased and the thickness thereof is being reduced. A semiconductor substrate having a large diameter and a small thickness may be bent or cracked at the time of conveyance or a polishing process. Therefore, after reinforcing the semiconductor substrate by bonding a supporting substrate thereto, the conveyance or polishing process is performed, and then the supporting substrate is peeled off from the semiconductor substrate.

For example, Japanese Laid-Open Patent Publication No. 2013-149655 discloses a method which adsorbs and holds a semiconductor substrate by a first holding unit and moves the outer periphery of a second holding unit in a vertical direction while maintaining an adsorbed and supported state of the supporting substrate by the second holding unit to peel off the supporting substrate from the semiconductor substrate.

SUMMARY

An aspect of the present disclosure provides a peel-off apparatus which peels off a superimposed substrate in which a first substrate and a second substrate are bonded into the first substrate and the second substrate, the peel-off apparatus comprising: a first holding unit which holds the first substrate of the superimposed substrate; a second holding unit which holds the second substrate of the superimposed substrate; and a moving unit which moves a part of an outer periphery of the first holding unit to be separated from the second holding unit. The first holding unit includes: a plate type elastic member which is connected to the moving unit; and a plurality of adsorbing units which is provided in the elastic member to adsorb the first substrate. Among the plurality of adsorbing units, an outer periphery adsorbing unit, which adsorbs an outer periphery of the first substrate which becomes a peel-off beginning point, includes: a pad member whose adsorbing surface of the first substrate is open to form a hollow portion; and a support member which is fitted into the hollow portion of the pad member and has a hardness which is higher than that of the pad member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
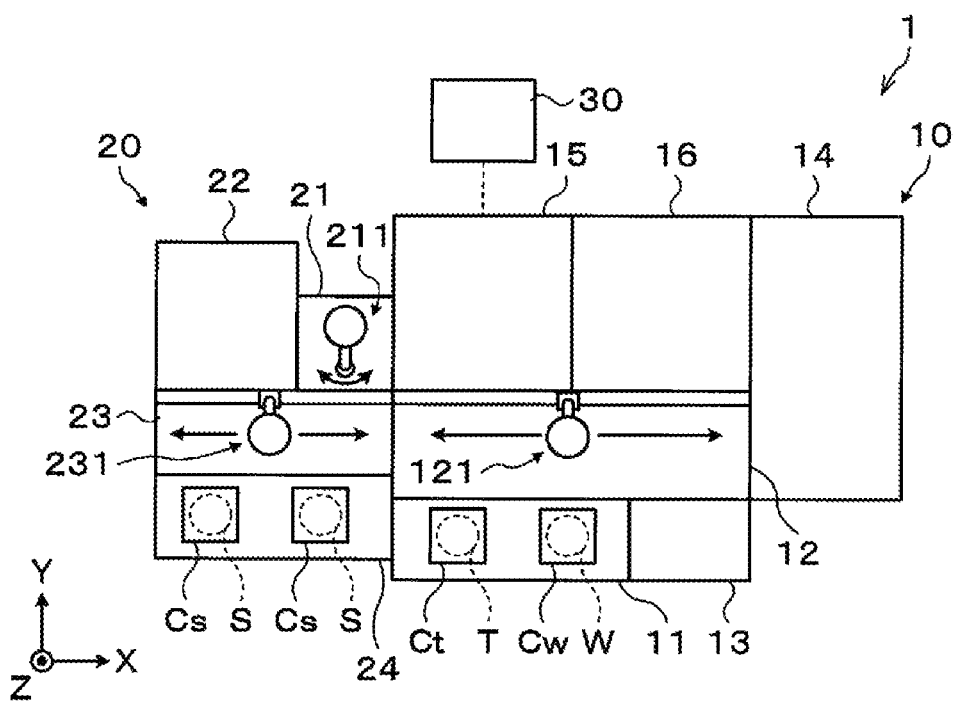
FIG. 1 is a schematic plan view illustrating a configuration of a peel-off system according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

According to the method disclosed in Japanese Laid-Open Patent Publication No. 2013-149655, only one portion of the outer periphery of the second holding unit is held to be moved in the vertical direction so that only one force is applied to the substrate. Therefore, there is a room for improvement in order to efficiently perform the peel-off processing.

The problem may be caused in a manufacturing process of a silicon on insulator (SOI) which accompanies a peeling-off process of the substrate.

The present disclosure has been made in an effort to efficiently perform a peel-off processing of a substrate to be processed and a supporting substrate.

An aspect of the present disclosure provides a peel-off apparatus which peels off a superimposed substrate in which a first substrate and a second substrate are bonded into the first substrate and the second substrate. The peel-off apparatus includes a first holding unit which holds the first substrate of the superimposed substrate; a second holding unit which holds the second substrate of the superimposed substrate; and a moving unit which moves a part of an outer periphery of the first holding unit to be separated from the second holding unit. The first holding unit includes a plate type elastic member which is connected to the moving unit; and a plurality of adsorbing units which is provided in the elastic member to adsorb the first substrate. Among the plurality of adsorbing units, an outer periphery adsorbing unit, which adsorbs an outer periphery of the first substrate which becomes a peel-off beginning point, includes: a pad member whose adsorbing surface of the first substrate is open to form a hollow portion; and a support member which is fitted into the hollow portion of the pad member and has a hardness which is higher than that of the pad member.

According to the present disclosure, a plurality of adsorbing units of a first holding unit adsorbs a first substrate, the first substrate is held by the first holding unit and a second substrate is held by a second holding unit. In this state, a part of an outer periphery of the first holding unit moves by a moving unit to be separated from the second holding unit. By doing this, an outer periphery adsorbing unit which is disposed at a peel-off beginning point is pulled so that the first substrate starts to be peeled off from the second substrate. In this case, an elastic member of the first holding unit has an elastic property so that when the moving unit pulls the first holding unit, the elastic member is elastically deformed by the pulling. Therefore, the first substrate is pulled so as to be rolled up from the outer periphery thereof without applying a large load to the superimposed substrate so that the first substrate and the second substrate are efficiently peeled off.

The inventors found out through a thorough examination that when the superimposed substrate is peeled off as described above, it is required to pull the outer periphery of the first substrate which is a peel-off beginning point at the time of starting the peel-off, with a large force. By doing this, the outer periphery adsorbing unit which adsorbs the outer periphery of the first substrate which is a peel-off beginning point needs to have an adsorbing force which is larger than a pulling force. Specifically, it is required to form the area of the adsorbing surface of the outer periphery adsorbing unit to be large. In this case, when an elastic body such as a rubber is used for the adsorbing unit, the adsorbing area is large and the pulling force is also large so that the adsorbing unit is deformed so that the first substrate may not be appropriately adsorbed. Therefore, the outer periphery adsorbing unit according to the present disclosure is configured such that a pad member and a support member are integrally formed. In this case, the support member has a high hardness so that deformation of the pad member may be suppressed. Further, the pad member and the support member are integrally formed so that the first substrate is adsorbed by the pad member and the support member, and the adsorbing area of the first substrate may be increased. Therefore, the outer periphery of the first substrate which is a peel-off beginning point may be appropriately adsorbed by the outer periphery adsorbing unit, and the first substrate and the second substrate may be appropriately peeled off.

Another aspect of the present disclosure provides a peel-off system including a peel-off apparatus which peels off a superimposed substrate in which a first substrate and a second substrate are bonded into the first substrate and the second substrate, a peel-off processing station which includes the peel-off apparatus, a carrying in/out station in which the superimposed substrate is disposed, and a substrate conveyance device which conveys the superimposed substrate between the peel-off processing station and the carrying in/out station. The peel-off apparatus includes a first holding unit which holds the first substrate of the superimposed substrate; a second holding unit which holds the second substrate of the superimposed substrate; and a moving unit which moves a part of an outer periphery of the first holding unit to be separated from the second holding unit. The first holding unit includes a plate type elastic member which is connected to the moving unit; and a plurality of adsorbing units which is provided in the elastic member to adsorb the first substrate. Among the plurality of adsorbing units, an outer periphery adsorbing unit, which adsorbs an outer periphery of the first substrate which becomes a peel-off beginning point, includes: a pad member whose adsorbing surface of the first substrate is open to form a hollow portion; and a support member which is fitted into the hollow portion of the pad member and has a hardness which is higher than that of the pad member.

Yet another aspect of the present disclosure provides a peel-off method which peels off a superimposed substrate in which a first substrate and a second substrate are bonded into the first substrate and the second substrate. The peel-off method includes a first holding process in which the first substrate of the superimposed substrate is held by a first holding unit which includes a plate shaped elastic member and a plurality of adsorbing units which is provided in the elastic member to adsorb the first substrate, a second holding process in which the second substrate of the superimposed substrate is held by a second holding unit, and a moving process in which a part of an outer periphery of the first holding unit is moved by the moving unit which is connected to the first holding unit to be separated from the second holding unit. An outer periphery adsorbing unit among the plurality of adsorbing units includes a pad member whose adsorbing surface of the first substrate is open to form a hollow portion, and a support member which is fitted into the hollow portion of the pad member and has a hardness which is higher than that of the pad member, and in the moving process, the outer periphery adsorbing unit adsorbs the outer periphery of the first substrate which becomes a peel-off beginning point.

According to the present disclosure, the substrate to be processed and the supporting substrate are efficiently and appropriately peeled off from each other.

Hereinafter, embodiments of the present disclosure will be described with reference to accompanying drawings. Further, the present disclosure is not limited by the embodiments which will be described below.

1. Peel-Off System

First, a configuration of a peel-off system according to an embodiment will be described with reference to FIGS. 1 to 3.

FIG. 1 is a schematic plan view illustrating a configuration of a peel-off system according to an embodiment. FIG. 2 is a schematic side view of a superimposed substrate which is held in a dicing frame and FIG. 3 is a schematic plan view of the superimposed substrate.

Hereinafter, in order to clearly define the positional relationship, an X axis direction, a Y axis direction, and a Z axis direction which are perpendicular to each other are defined, and a positive direction of a Z axis is defined as an upward vertical direction.

The peel-off system 1 according to an embodiment illustrated in FIG. 1 peels off a superimposed substrate T (see, for example, FIG. 2) in which a substrate W to be processed serving as a second substrate and a supporting substrate S serving as a first substrate are bonded by an adhesive agent G into the substrate W to be processed and the supporting substrate S.

Figure 2:
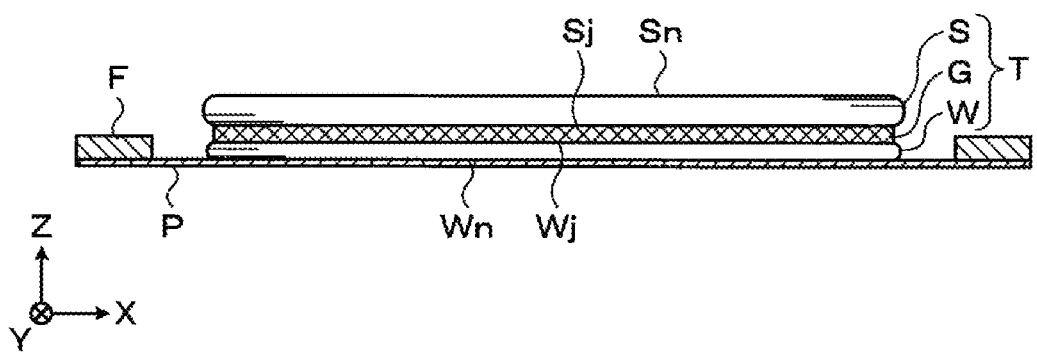
FIG. 2 is a schematic side view of a superimposed substrate which is held in a dicing frame.

Hereinafter, as illustrated in FIG. 2, between the surfaces of the substrate W to be processed, a surface which is bonded with the supporting substrate S by the adhesive agent G is referred to as a "bonded surface Wj" and a surface which is opposite to the bonded surface Wj is referred to as a "non-bonded surface Wn". Further, between the surfaces of the supporting substrate S, a surface which is bonded with the substrate W to be processed by the adhesive agent G is referred to as a "bonded surface Sj" and a surface which is opposite to the bonded surface Sj is referred to as a "non-bonded surface Sn".

The substrate W to be processed is a substrate where a plurality of electronic circuits is formed on a semiconductor substrate such as a silicon wafer or a compound semiconductor wafer and a surface on which the electronic circuits are formed serves as a bonded surface Wj. Further, the substrate W to be processed is formed to be thin by polishing the non-bonded surface Wn. Specifically, the thickness of the substrate W to be processed is approximately 20 μm to 50 μm.

In the meantime, the supporting substrate S has the approximately same diameter as that of the substrate W to be processed and supports the substrate W to be processed. The thickness of the supporting substrate S is approximately 650 μm to 750 μm. In addition to a silicon wafer, a glass substrate may be used for the supporting substrate S. Further, the thickness of the adhesive agent G which bonds the substrate W to be processed and the supporting substrate S is approximately 40 μm to 150 μm.

Figure 3:
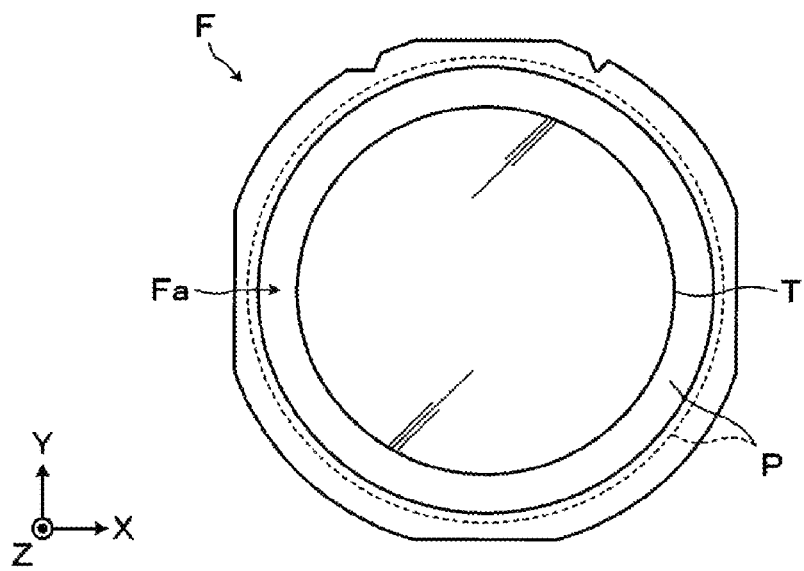
FIG. 3 is a schematic plan view of a superimposed substrate which is held in a dicing frame.

As illustrated in FIG. 3, the superimposed substrate T is fixed to a dicing frame F. The dicing frame F is an approximately ring shaped member having an opening Fa whose diameter is larger than the superimposed substrate T at a center and formed of a metal such as stainless steel. The thickness of the dicing frame is, for example, approximately 1 mm.

The superimposed substrate T is fixed to the dicing frame F by a dicing tape P. Specifically, the superimposed substrate T is disposed at the opening Fa of the dicing frame F and the dicing tape P is adhered onto the non-bonded surface Wn of the substrate W to be processed and a rear surface of the dicing frame F so as to block the opening Fa from the rear surface. By doing this, the superimposed substrate T is fixed to the dicing frame F.

As illustrated in FIG. 1, the peel-off system 1 includes two processing blocks of a first processing block 10 and a second processing block 20. The first processing block 10 and the second processing block 20 are disposed to be adjacent to each other.

In the first processing block 10, the superimposed substrate T is carried in, the superimposed substrate T is peeled off, and the peeled-off substrate W to be processed is washed and carried out. The first processing block 10 includes a carrying in/out station 11, a first conveyance region 12, a standby station 13, an edge cut station 14, a peel-off station 15, and a first washing station 16.

The carrying in/out station 11, the standby station 13, the edge cut station 14, the peel-off station 15, and the first washing station 16 are disposed to be adjacent to the first conveyance region 12. Specifically, the carrying in/out station 11 and the standby station 13 are disposed in parallel in a negative direction of the Y axis of the first conveyance region 12, and the peel-off station 15 and the first washing station 16 are disposed in parallel in a positive direction of a Y axis of the first conveyance region 12. Further, the edge cut station 14 is disposed in a positive direction of the X axis of the first conveyance region 12.

A plurality of cassette placing tables is provided in the carrying in/out station 11 and a cassette Ct in which the superimposed substrate T is accommodated or a cassette Cw in which a peeled-off substrate W to be processed is accommodated is disposed on each cassette placing table.

In the first conveyance region 12, a first conveyance device 121 serving as a substrate conveyance device which conveys the superimposed substrate T or the peeled-off substrate W to be processed is disposed. The first conveyance device 121 includes a conveyance arm unit which moves in a horizontal direction, is lifted in a vertical direction, and pivots around the vertical direction and a substrate holding unit which is attached to a leading edge of the conveyance arm unit. In the first conveyance region 12, a processing is performed which conveys the superimposed substrate T to the standby station 13, the edge cut station 14, and the peel-off station 15 by the first conveyance device 121, or a processing is performed which conveys the peeled-off substrate W to be processed to the first washing station 16 and the carrying in/out station 11.

In the standby station 13, an ID reading device which reads an identification ID of the dicing frame F is disposed and the superimposed substrate T which is being processed is identified by the ID reading device. Further, in the standby station 13, in addition to the ID reading processing, a standby processing is performed if necessary through which the superimposed substrate T which waits to be processed is temporally put in a standby state. In the standby station 13, a placing table on which the superimposed substrate T which is conveyed by the first conveyance device 121 is disposed is provided, and the ID reading device and a temporary standby unit are disposed on the placing table.

An edge cut device is disposed in the edge cut station 14. The edge cut device performs an edge cut processing which dissolves and removes the periphery of the adhesive agent G (see FIG. 2) using a solvent. The substrate W to be processed and the supporting substrate S may be easily peeled off in the peel-off processing which will be described below, by removing the periphery of the adhesive agent G by the edge cut processing. The edge cut device immerses the superimposed substrate T in the solvent of the adhesive agent G to dissolve the periphery of the adhesive agent G by the solvent.

A peel-off apparatus is disposed in the peel-off station 15, and a peel-off processing which peels off the superimposed substrate T into the substrate W to be processed and the supporting substrate S is performed by the peel-off apparatus. Specific configuration and operation of the peel-off apparatus will be described below.

In the first washing station 16, a washing processing of the peeled-off substrate W to be processed is performed. In the first washing station 16, a first washing device which washes the peeled-off substrate W to be processed, which is held in the dicing frame F, is disposed. A washing device disclosed in, fore example, Japanese Laid-Open Patent Publication No. 2013-033925 may be used as the first washing device.

In the second processing block 20, the peeled-off supporting substrate S is washed and carried out. Such a second processing block 20 includes a delivery station 21, a second washing station 22, a second conveyance region 23, and a carrying out station 24.

The delivery station 21, the second washing station 22, and the carrying out station 24 are disposed to be adjacent to the second conveyance region 23. Specifically, the delivery station 21 and the second washing station 22 are disposed in parallel in a positive direction of the Y axis of the second conveyance region 23, and the carrying out station 24 is disposed in parallel to a negative direction of the Y axis of the second conveyance region 23.

The delivery station 21 is disposed to be adjacent to the peel-off station 15 of the first processing block 10. In such a delivery station 21, a delivery processing is performed receiving the supporting substrate S which is peeled off from the peel-off station 15 and delivering the supporting substrate S to the second washing station 22.

A second conveyance device 211 is disposed in the delivery station 21. The second conveyance device 211 includes a noncontact holding unit such as a Bernoulli chuck, and the peeled-off supporting substrate S is contactlessly conveyed by the second conveyance device 211.

In the second washing station 22, a second washing processing is performed which washes the peeled-off supporting substrate S. In the second washing station 22, a second washing device which washes the peeled-off supporting substrate S is disposed. A washing device disclosed in, for example, Japanese Laid-Open Patent Publication No. 2013-033925 may be used as the second washing device.

In the second conveyance region 23, a third conveyance device 231 which conveys the peeled-off supporting substrate S is disposed. The third conveyance device 231 includes a conveyance arm unit which moves in a horizontal direction, elevates in a vertical direction, and pivots around the vertical direction and a substrate holding unit which is attached to a leading edge of the conveyance arm unit. In the second conveyance region 23, a processing which conveys the peeled-off supporting substrate S to the carrying out station 24 is performed by the third conveyance device 231.

A plurality of cassette placing tables is provided in the carrying out station 24, and a cassette Ct in which the peeled-off supporting substrate S is accommodated is disposed on each cassette placing table.

The peel-off system 1 includes a control device 30. The control device 30 is a device which controls an operation of the peel-off system 1. The control device 30 may be, for example, a computer, and includes a control unit and a storing unit which are not illustrated. A program which controls various processings such as a peel-off processing is stored in the storing unit. The control unit reads out and executes the program stored in the storing unit to control the operation of the peel-off system 1.

Such a program may be stored in a computer readable storage medium and installed in the storing unit of the control device 30 from the storage medium. The computer readable storage medium includes, for example, a hard disk HD, a flexible disk FD, a compact disk CD, a magnet optical disk MO, and a memory card.

Next, a peel-off processing method of a substrate W to be processed and a supporting substrate S which is performed using a peel-off system 1 configured as described above will be described.

In the peel-off system 1, the first conveyance device 121 of the first processing block 10 first ejects the superimposed substrate T from the cassette Ct disposed on the carrying in/out station 11 and carries the ejected superimposed substrate T into the standby station 13.

Subsequently, in the standby station 13, the ID reading device performs the ID reading processing which reads out an ID of the dicing frame F. The ID read out by the ID reading device is transmitted to the control device 30. Next, the superimposed substrate T is ejected from the standby station 13 by the first conveyance device 121 to be carried into the edge cut station 14.

In the edge cut station 14, the edge cut device performs an edge cut processing on the superimposed substrate T. The substrate W to be processed and the supporting substrate S may be easily peeled off in the peel off processing in a subsequent stage, by removing the periphery of the adhesive agent G by the edge cut processing. Therefore, a time required to perform the peel-off processing may be shortened.

As described above, in the peel-off system 1 according to the present embodiment, since the edge cut station 14 is included in the first processing block 10, the superimposed substrate T which is carried in the first processing block 10 may be directly carried into the edge cut station 14 using the first conveyance device 121. A throughput of a series of substrate processings may accordingly be improved. Further, a time from the edge cut processing to the peel-off processing is easily managed, so that the peel-off performance may be stabilized.

For example, when there is a superimposed substrate T which waits for a processing due to a processing time difference between devices, the superimposed substrate T may be temporally put in a standby state using a temporary standby unit which is provided in the standby station 13 so that a time loss in a series of processes may be shortened.

Subsequently, the superimposed substrate T to which the edge cut processing has been subjected is ejected from the edge cut station 14 by the first conveyance device 121 to be carried into the peel-off station 15. The peel-off apparatus which is disposed in the peel-off station 15 performs the peel-off processing on the superimposed substrate T. By the peel-off processing, the superimposed substrate T is separated into the substrate W to be processed and the supporting substrate S.

The peeled-off substrate W to be processed is ejected from the peel-off station 15 by the first conveyance device 121 to be carried into the first washing station 16. In the first washing station 16, a first washing device performs a first washing processing on the peeled-off substrate W to be processed. By such a first washing processing, an adhesive agent G which remains on the bonded surface Wj of the substrate W to be processed is removed.

The substrate W to be processed to which the first washing processing has been subjected is ejected from the first washing station 16 by the first conveyance device 121 to be accommodated in the cassette Cw which is disposed in the carrying in/out station 11. Thereafter, the cassette Cw is ejected from the carrying in/out station 11 to be recycled. By doing this, a processing on the substrate W to be processed is completed.

In the meantime, in the second processing block 20, a processing on the peeled-off supporting substrate S is performed in parallel with the above-described processing in the first processing block 10.

In the second processing block 20, the second conveyance device 211 which is disposed in the delivery station 21 first ejects the peeled-off supporting substrate S from the peel-off station 15 to carry the supporting substrate S into the second washing station 22.

Here, an upper surface, that is, the non-bonded surface of the peeled-off supporting substrate S is held by the peel-off apparatus, and the second conveyance device 211 contactlessly holds the bonded surface Sj of the supporting substrate S from a lower side thereof. Thereafter, the second conveyance device 211 reverses the held supporting substrate S and then disposes the supporting substrate S in the second washing device of the second washing station 22. Accordingly, the supporting substrate S is disposed in the second washing device in a state where the bonded surface Sj on which the adhesive agent G remains upwardly faces. The second washing device performs the second washing processing which washes the bonded surface Sj of the supporting substrate S. The adhesive agent G which remains on the bonded surface Sj of the supporting substrate S is removed by such a second washing processing.

The supporting substrate S to which the second washing processing has been subjected is ejected from the second washing station 22 by a third conveyance device 231 which is disposed in the second conveyance region 23 to be accommodated in the cassette Cs disposed in the carrying out station 24. Thereafter, the cassette Cs is ejected from the carrying out station 24 to be recycled. By doing this, a processing on the supporting substrate S is completed.

As described above, the peel-off system 1 according to the present embodiment is configured to include a front end (the carrying in/out station 11 and the first conveyance device 121) for the substrates (the superimposed substrate T and the peeled-off substrate W to be processed) which are fixed to the dicing frame F, and a front end (the carrying out station 24 and the third conveyance device 231) for the substrate (the peeled-off supporting substrate S) which is not held to the dicing frame F. Therefore, a processing of conveying the substrate W to be processed into the carrying in/out station 11 and a processing of conveying the supporting substrate S into the carrying out station 24 may be performed in parallel so that a series of processings for the substrates may be efficiently performed.

In the peel-off system 1 according to the present embodiment, the peel-off station 15 and the second washing station 22 are connected with each other through the delivery station 21. Therefore, the peeled-off supporting substrate S may be directly carried from the peel-off station 15 into the second washing station 22 without passing through the first conveyance region 12 or the second conveyance region 23, so that the peeled-off supporting substrate S may be smoothly conveyed.

The first processing block 10 may include a mount device which attaches the dicing frame F onto the superimposed substrate T. In this case, the superimposed substrate T to which the dicing frame F is not attached is ejected from the cassette Ct to be carried into the mount device, and the dicing frame F is attached onto the superimposed substrate T in the mount device, and then the superimposed substrate T which is fixed to the dicing frame F is sequentially conveyed onto the edge cut station 14 and the peel-off station 15. Further, the mount device may be disposed in a location where, after moving the edge cut station 14 to the second processing block 20, the edge cut station 14 has been provided.

2. Configuration of Peel-Off Apparatus

Figure 4:
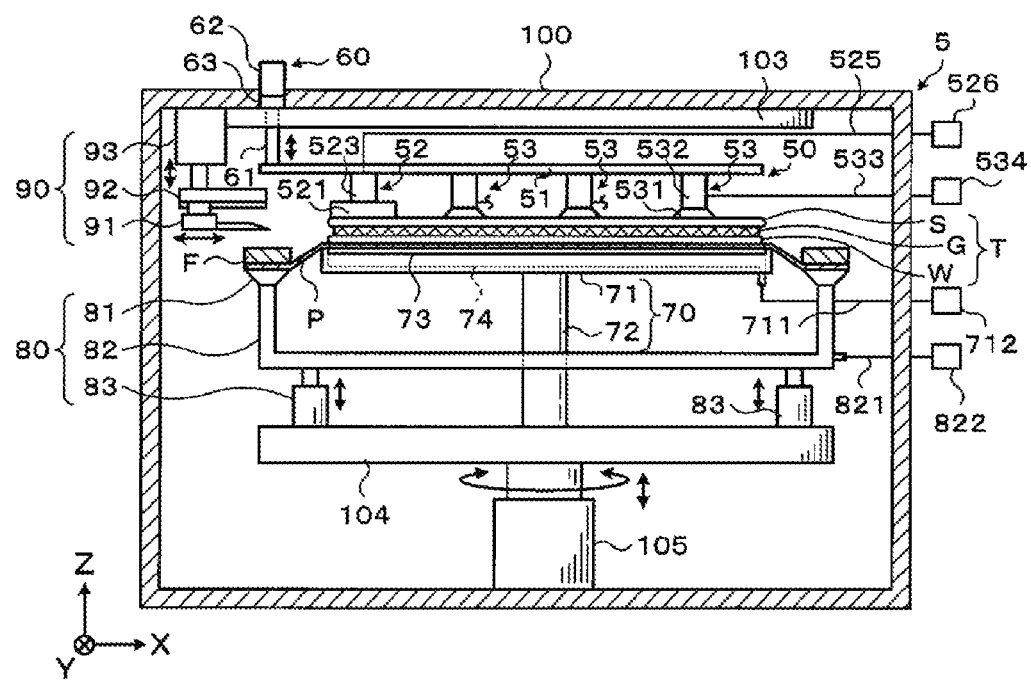
FIG. 4 is a schematic side view illustrating a configuration of a peel-off apparatus according to an embodiment.

Next, a configuration of the peel-off apparatus which is provided in the peel-off station 15 will be described with reference to FIG. 4. FIG. 4 is a schematic side view illustrating a configuration of the peel-off apparatus 5 according to an embodiment.

As illustrated in FIG. 4, the peel-off apparatus 5 includes a processing chamber 100. Carrying in/out ports (not illustrated) are provided at the sides of the processing chamber 100. The carrying in/out ports are provided at a side facing the first conveyance region 12 and a side facing the delivery station 21, respectively.

The peel-off apparatus 5 includes a first holding unit 50, a moving unit 60, a second holding unit 70, a frame holding unit 80, and a peel-off inducing unit 90, which are disposed in the processing chamber 100.

The peel-off apparatus 5 adsorbs and holds a side of the superimposed substrate T which faces the supporting substrate S from an upper side using the first holding unit 50, and adsorbs and holds a side of the superimposed substrate T which faces the substrate W to be processed from a lower side by the second holding unit 70. The peel-off apparatus 5 moves the supporting substrate S using the moving unit 60 to be separated from the surface of the substrate W to be processed. By doing this, the supporting substrate S which is held by the holding unit 50 is continuously peeled off from the substrate W to be processed from one end to the other end. Hereinafter, individual components will be described in detail.

The first holding unit 50 includes an elastic member 51 and a plurality of adsorbing units 52 and 53. The elastic member 51 is a thin-plate shaped member and for example, formed of a metal such as sheet metal. Such an elastic member 51 is disposed so as to be opposite to the supporting substrate S at the upper side of the supporting substrate S. The plurality of adsorbing units 52 and 53 are provided on a surface of the elastic member 51 which is opposite to the supporting substrate S.

Figure 5:
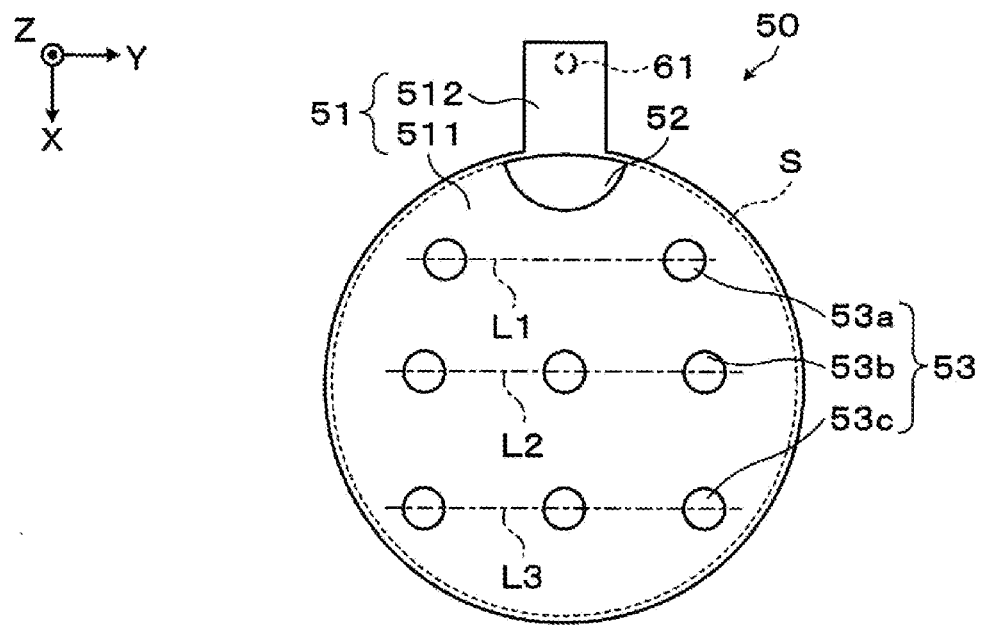
FIG. 5 is a schematic plan view of a first holding unit seen from a lower portion.

As illustrated in FIG. 5, the elastic member 51 includes a main body 511 and an extension unit 512. The main body 511 has a disk shape having the approximately same outer diameter as the diameter of the supporting substrate S. The extension unit 512 is a portion where a part of an outer periphery (in this case, an outer periphery of a negative direction of the X axis) which is disposed at the earliest peel-off beginning point, among outer peripheries of the main body 511 extends in an opposite direction (the negative direction of the X axis) of a peeling-off direction. A columnar member 61 of the moving unit 60 is connected to the leading edge of the extension unit 512.

The plurality of adsorbing units 52 and 53 include an outer periphery adsorbing unit 52 which adsorbs the outer periphery of the supporting substrate S and an inner periphery adsorbing unit 53 which adsorbs an inner periphery of the supporting substrate S. The outer periphery adsorbing unit 52 will be described first.

The outer periphery adsorbing unit 52 is disposed in a position (in this case, the outer periphery of the negative direction of the X axis) where an outer periphery of the supporting substrate S which is a peel-off beginning point is adsorbed. An outer edge of the outer periphery adsorbing unit 52 in the negative direction of the X axis is curved along an outer edge of the supporting substrate S. Further, the outer periphery adsorbing unit 52 is disposed in a position where the outer edge of the outer periphery adsorbing unit 52 in the negative direction side of the X axis coincides with the outer edge of the supporting substrate S. Further, even though a shape of the outer edge of the outer periphery adsorbing unit 52 in the positive direction side of the X axis is not specifically limited, the outer edge is curved in the present embodiment.

The size of the outer periphery adsorbing unit 52 as seen from a plan view, that is, a surface which is adsorbed onto the supporting substrate S is determined so as to satisfy two conditions as follows. Further, an adsorbing surface of the outer periphery adsorbing unit 52 is configured by an adsorbing surface 521a of a pad member 521 and an adsorbing surface 522a of the supporting member 522 which will be described below.

A first condition is that an area of the adsorbing surface of the outer periphery adsorbing unit 52 needs to be ensured so as to endure a force which is applied to the outer periphery adsorbing unit 52. When the superimposed substrate T starts to be peeled off, that is, the outer periphery of the supporting substrate S which is a peel-off beginning point is pulled, the beginning point needs to be pulled with a great strength such as, for example, 150 N. Therefore, the outer periphery adsorbing unit 52 needs to have an adsorbing force which is larger than the above pulling force, and an area of the adsorbing surface of the outer periphery adsorbing unit 52 needs to be large.

Figure 6:
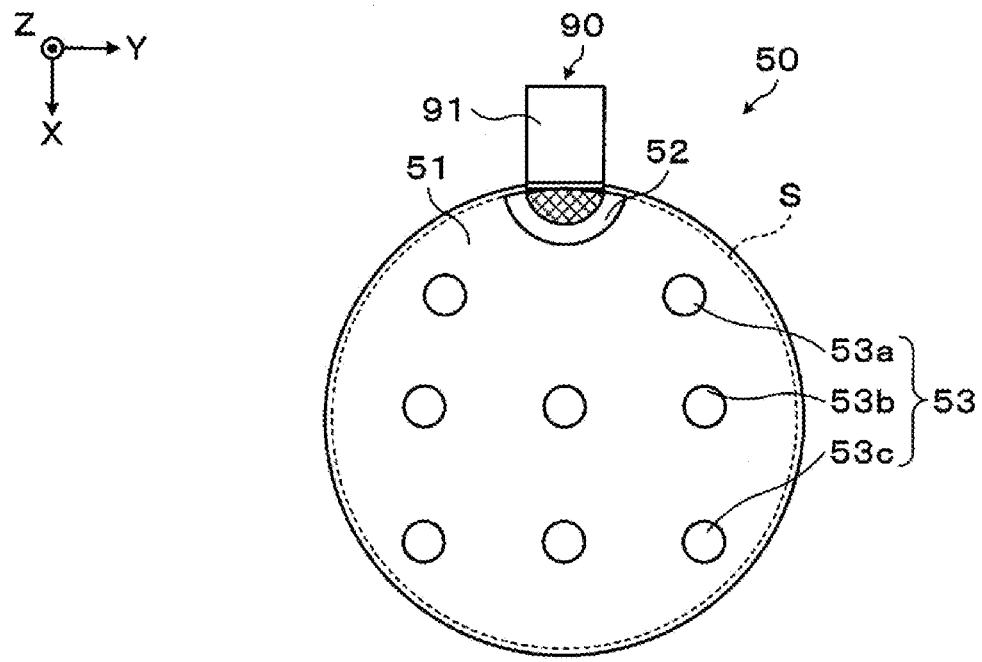
FIG. 6 is a schematic plan view of a first holding unit seen from a lower portion.

A second condition is that an adsorbing surface of the outer periphery adsorbing unit 52 is formed such that the peel-off starting portion M which is formed by the peel-off inducing unit 90 is adsorbed by the outer periphery adsorbing unit 52, as illustrated in FIG. 6. As will be described below, the peel-off starting portion M is a portion which triggers to peel off the supporting substrate S from the substrate W to be processed. The peel-off starting portion M is adsorbed by the outer periphery adsorbing unit 52 so that it can be ensured that the supporting substrate S starts to be peeled off. Further, the supporting substrate S is pulled to be rolled up from the peel-off starting portion M so that the supporting substrate S is efficiently peeled off from the substrate W to be processed.

Figure 7:
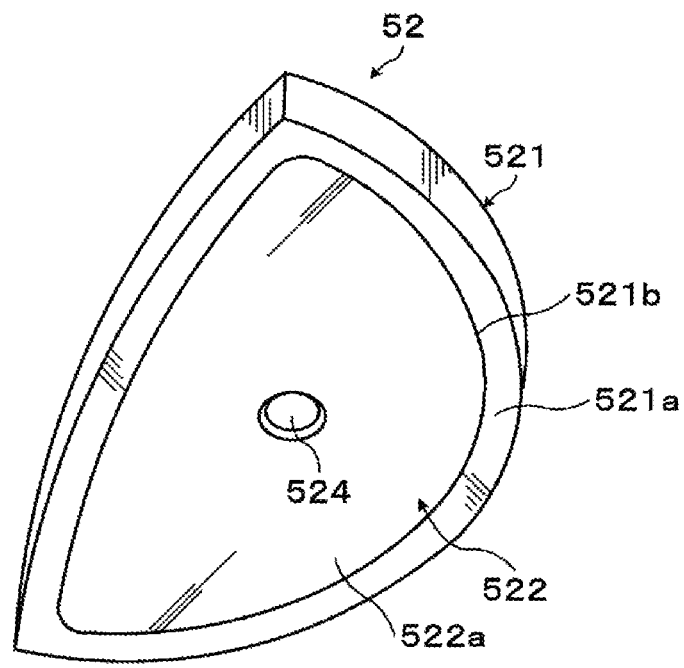
FIG. 7 is a perspective view of an outer periphery adsorbing unit seen from a lower portion.
Figure 8:
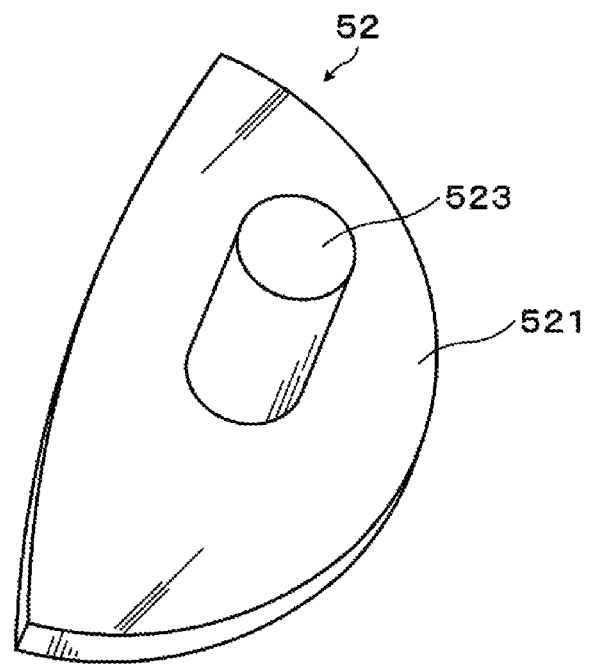
FIG. 8 is a perspective view of an outer periphery adsorbing unit seen from an upper portion.
Figure 9:
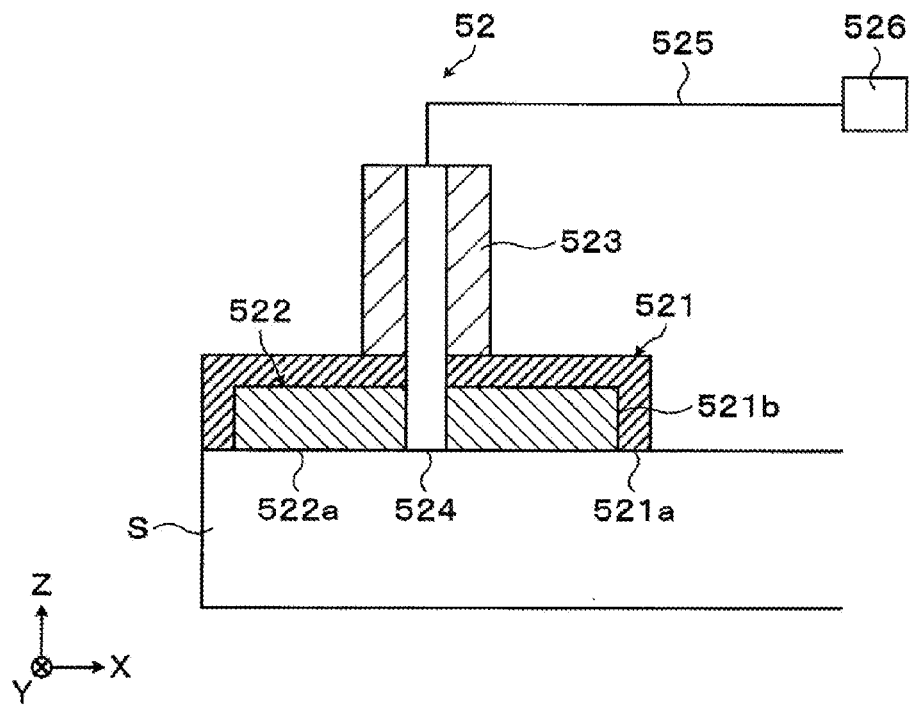
FIG. 9 is a schematic cross-sectional view of an outer periphery adsorbing unit.

The outer periphery adsorbing unit 52, as illustrated in FIGS. 7 to 9, includes a pad member 521, a support member 522, and a sustaining member 523. The sustaining member 523 is fixed to the elastic member 51 and provided on a top surface of the pad member 521 to sustain the pad member 521 and the support member 522.

An adsorbing surface 521a of the pad member 521 with respect to the supporting substrate S is open so that a hollow portion 521b is formed in the pad member 521. An elastic material which is extendable against the pulling force which is applied to the outer periphery adsorbing unit 52 is used for the pad member 521. Specifically, a rubber having a hardness of 35 degrees to 60 degrees is used. Further, when a processing limitation of the material is considered, a rubber having a hardness of 45 degrees is more desirably used. The type of rubber is not specifically limited, and for example, a CR rubber (chloroprene rubber), a silicon rubber, or an ethylene propylene diene monomer (EPDM) rubber is used.

In the pad member 521, a portion (an outer edge of the pad member 521 in the negative direction of the X axis) corresponding to the outer edge of the supporting substrate S coincides with the outer edge of the supporting substrate S. By doing this, the pad member 521 may certainly adsorb the outer periphery of the supporting substrate S including the outer edge thereof. Further, the outer edge of the pad member 521 in the negative direction side of the X axis may be in contact with the outer edge of the supporting substrate S, for example, the outer edge may outwardly protrude from the outer edge of the supporting substrate S. Even in this case, the pad member 521 adsorbs the outer edge of the supporting substrate S to appropriately adsorb the outer periphery of the supporting substrate S.

The support member 522 is fitted into the hollow portion 521b of the pad member 521. Further, an adsorbing surface 522a of the support member 522 with respect to the supporting substrate S is formed on the same plane as the adsorbing surface 521a of the pad member 521. That is, as described above, the adsorbing surface of the outer periphery adsorbing unit 52 with respect to the supporting substrate S is configured by the adsorbing surface 521a of the pad member 521 and the adsorbing surface 522a of the support member 522.

A material which has a higher hardness than that of the pad member 521 and has a hardness which prevents a deformation by the pulling force applied to the outer periphery adsorbing unit 52, is used for the support member 522. Specifically, a metal such as aluminum, iron, or SUS (stainless steel) or a plastic based resin may be used.

An intake port 524 is formed on the adsorbing surface 522a of the support member 522. The intake port 524 is connected to an intake device 526 such as a vacuum pump through an intake pipe 525 which is inserted into the support member 522, the pad member 521, and the sustaining member 523. The outer periphery adsorbing unit 52 adsorbs the outer periphery of the supporting substrate S through the adsorbing surface 521a of the pad member 521 and the adsorbing surface 522a of the supporting member 522 by an attractive force generated by the intake device 526.

Here, an effect will be described for a case where the outer periphery adsorbing unit 52 is configured to have a double layered structure of the pad member 521 and the support member 522 as described in the present embodiment. As described above, when the outer periphery of the supporting substrate S which is a peel-off beginning point is pulled, it is required that the beginning point needs to be pulled with a large force, so that the area of the outer periphery adsorbing unit 52 needs to be large.

Figure 10:
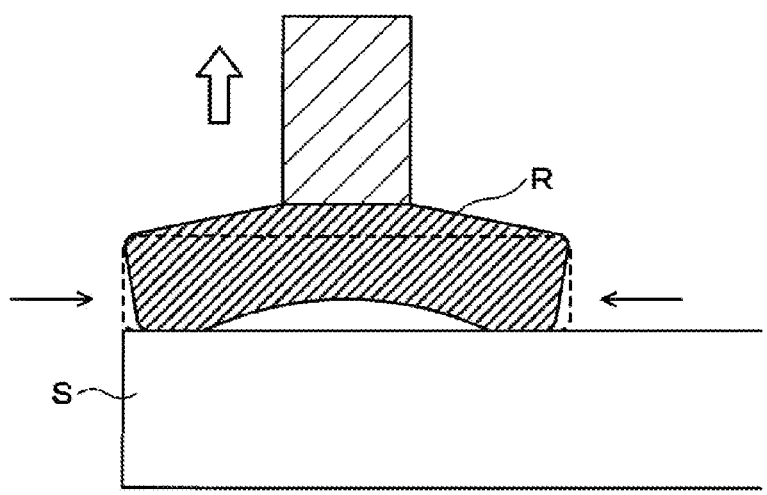
FIG. 10 is an explanatory view illustrating a case where only a rubber member is used for an outer periphery adsorbing unit.

In this case, for example, as illustrated in FIG. 10, when the supporting substrate S is adsorbed only by the rubber member R, if the outer periphery adsorbing unit is pulled, an inner periphery of the rubber member R is pulled, and thus a horizontal force is applied to the outer periphery of the rubber member R. The rubber is weak to the horizontal force so that the outer periphery of the rubber member R inwardly moves while the inner periphery of the rubber member R upwardly moves. If so, the supporting substrate S is not adsorbed by the entire surface of the rubber member R. Further, there is a gap between the rubber member R and the supporting substrate S, and leak (suction leakage) of air may be caused through the gap. Therefore, when only the rubber member R is used, the supporting substrate S may not be appropriately adsorbed.

For example, when the supporting substrate S is adsorbed only using a material having a high hardness, such as a metal member, the metal member is not stretched as the outer periphery adsorbing unit is pulled. In this case, when the outer periphery adsorbing unit is pulled, the metal member is separated from the supporting substrate S so that the supporting substrate S is not appropriately adsorbed.

In contrast, according to the present embodiment, as illustrated in FIG. 9, when the outer periphery adsorbing unit 52 is pulled, the supporting member 522 is not deformed while the pad member 521 is upwardly stretched. Therefore, as illustrated in FIG. 10 described above, no horizontal force is applied to the pad member 521 so that the pad member 521 is appropriately in contact with the supporting substrate S. Further, the pad member 521 is integrated with the support member 522 to adsorb the supporting substrate S by the entire adsorbing surfaces 521a and 522a so that the supporting substrate S may be appropriately adsorbed.

Next, the inner periphery adsorbing unit 53 of the plurality of adsorbing units 52 and 52 will be described. The inner periphery adsorbing unit 53 is disposed in a position where the inner periphery of the supporting substrate S is adsorbed, as described in FIG. 5. The inner periphery adsorbing unit 53 includes a first adsorbing unit group which includes two inner periphery adsorbing units 53a, a second adsorbing unit group which includes three inner periphery adsorbing units 53b, and a third adsorbing unit group which includes three inner periphery adsorbing units 53c. The first to third adsorbing unit groups are disposed in the order of the first adsorbing unit group, the second adsorbing unit group, and the third adsorbing unit group along the peeling-off direction (the positive direction of the X axis).

Two inner periphery adsorbing units 53a included in the first adsorbing unit group are disposed in parallel in a direction (the Y axis direction) perpendicular to the peeling-off direction (the positive direction of the X axis) (see, for example, an imaginary line L1 of FIG. 5). Similarly, the three inner periphery adsorbing units 53b included in the second adsorbing unit group and the three inner periphery adsorbing units 53c included in the third adsorbing unit group are also disposed in parallel in the direction (the Y axis direction) perpendicular to the peeling-off direction (see, for example, imaginary lines L2 and L3 of FIG. 5).

As described above, among the plurality of adsorbing units 52 and 53 provided in the first holding unit 50, the inner periphery adsorbing units 53a, 53b, and 53c other than the outer periphery adsorbing unit 52 which is provided at the earliest peel-off beginning point, are disposed in parallel in the direction perpendicular to the peeling-off direction to have a multi-layered structure in the peeling-off direction.

Therefore, the supporting substrate S is efficiently peeled off from the substrate W to be processed by the plurality of inner periphery adsorbing units 53a, 53b, and 53c while certainly starting peeling-off the supporting substrate S by the outer periphery adsorbing unit 52 at the peeling-off beginning point.

Each inner periphery adsorbing unit 53 includes, as illustrated in FIG. 4, an adsorbing pad 531 which adsorbs the supporting substrate S, and a sustaining member 532 which is fixed to the elastic member 51 and sustains the adsorbing pad 531 from the lower portion.

Each inner periphery adsorbing unit 53 is connected to the intake device 534 such as a vacuum pump through the intake pipe 533. The plurality of inner periphery adsorbing units 53 adsorbs the inner periphery of the supporting substrate S by an attractive force generated by the intake device 534.

The adsorbing pad 531 which is provided in the inner periphery adsorbing unit 53 may have a small deformation amount. This is because, when the moving unit 60 which will be described below, pulls the first holding unit 50 and the adsorbing pad 531 is significantly deformed, a portion of the supporting substrate S to be adsorbed is significantly deformed by the deformation, so that the supporting substrate S or the substrate W to be processed may be damaged. Specifically, as for the adsorbing pad 531, a pad having a rib on an adsorbing surface or a pad using a flat pad having a height of a space which is equal to or smaller than 0.5 mm may be used.

Returning back to FIG. 4, other configuration of the peel-off apparatus 5 will be described. The moving unit 60 includes a columnar member 61, a moving mechanism 62, and a load cell 63.

The columnar member 61 is a member which extends in a vertical direction (the Z axis direction) and one end thereof is connected to the extension unit 512 (see, for example, FIG. 5) of the elastic member 51, and the other end is connected to the moving mechanism 62 through an upper base unit 103.

The moving mechanism 62 is fixed to the upper portion of the upper base unit 103 and moves the columnar member 61 connected to the lower portion in a vertical direction. The load cell 63 detects a load applied to the columnar member 61.

Such a moving unit 60 moves the columnar member 61 upward in a vertical direction using the moving mechanism 62 to pull up the first holding unit 50 which is connected to the columnar supporting member 61. In this case, the moving unit 60 may pull the first holding unit 50 while controlling a force which is applied to the supporting substrate S based on a result detected by the load cell 63.

Here, as illustrated in FIG. 5, the columnar member 61 which becomes a pulling-up operating point is disposed in an opposite direction to the peeling-off direction of the outer periphery adsorbing unit 52 which is disposed at the earliest peeling-off beginning point (in this case, the negative direction of the X axis) and becomes a pull-up beginning point. Here, the peeling-off direction is defined as a positive direction of the X axis.

Therefore, a clock wise rotative force (moment) in FIG. 4 is generated in the outer periphery (which is a peel-off starting position and corresponds to a "peel-off starting portion M" which will be described below) of the superimposed substrate T which becomes an pull-up operating point. Therefore, the moving unit 60 pulls the supporting substrate S so as to be rolled up from the outer edge so that the supporting substrate S is efficiently peeled off from the substrate W to be processed.

The first holding unit 50 is supported by the moving unit 60 and the moving unit 60 is supported by the upper base unit 103. Further, the upper base unit 103 is supported by a ceiling of the processing chamber 100.

The second holding unit 70 is disposed below the first holding unit 50 and adsorbs a side of the superimposed substrate T which faces the substrate W to be processed by the dicing tape P. Such a second holding unit 70 includes a disk shaped main body 71 and a columnar member 72 which supports the main body 71.

The main body 71 is formed of a metal member such as aluminum. An adsorbing surface 73 is provided on a top surface of the main body 71. The adsorbing surface 73 is a porous body, and for example, formed of a resin member such as polychlorotrifluoroethylene (PCTFE).

An attracting space 74 which communicates with the outside through the adsorbing surface 73 is formed in the main body 71. The attracting space 74 is connected to the intake device 712 such as a vacuum pump through the intake pipe 711. Such a second holding unit 70 adsorbs the non-bonded surface Wn of the substrate W to be processed onto the adsorbing surface 73 through the dicing tape P using a negative pressure which is generated by the intake of the intake device 712 to adsorb the superimposed substrate T.

The adsorbing surface 73 of the main body 71 is formed to have a diameter which is slightly larger than that of the substrate W to be processed. By doing this, the attracting leakage in the periphery of the substrate W to be processed is prevented so that the superimposed substrate T may be certainly adsorbed and held.

When a non-adsorbing portion, such as a groove, is formed on the adsorbing surface with the substrate W to be processed, a crack may be generated on the substrate W to be processed in the non-adsorbing portion. Therefore, the adsorbing surface 73 of the main body 71 is a flat surface which does not have the non-adsorbing portion such as a groove. Therefore, it is possible to prevent a crack from being generated on the substrate W to be processed. Further, the adsorbing surface 73 is formed of a resin member such as PCTFE so that the damage to the substrate W to be processed may be further suppressed.

A frame holding unit 80 which holds the dicing frame F from the lower side is disposed at the outside of the second holding unit 70. The frame holding unit 80 includes a plurality of adsorbing pads 81 which adsorbs and holds the dicing frame F, a sustaining member 82 which sustains the adsorbing pads 81, and a moving mechanism 83 which moves the sustaining member 82 in a vertical direction.

The adsorbing pads 81 are formed of an elastic member such as a rubber, and for example, provided in positions corresponding to four corners of the dicing frame F illustrated in FIG. 3. An attraction port (not illustrated) is formed in the adsorbing pad 81 and an intake device 822 such as a vacuum pump is connected to the attraction port through the sustaining member 82 and an intake pipe 821.

The frame holding unit 80 adsorbs the dicing frame F using a negative pressure which is generated by the intake of the intake device 822 to hold the dicing frame F. Further, the frame holding unit 80 moves the sustaining member 82 and the adsorbing pad 81 in a vertical direction by the moving mechanism 83 to move the dicing frame F which is adsorbed and held to the adsorbing pad 81 in the vertical direction.

The second holding unit 70 and the frame holding unit 80 are supported by a lower base unit 104 from the lower side. Further, the lower base unit 104 is supported by a rotary elevating mechanism 105 which is fixed to a bottom surface of the processing chamber 100.

The rotary elevating mechanism 105 rotates the lower base unit 104 around a vertical axis to integrally rotate the second holding unit 70 and the frame holding unit 80 which are supported by the lower base unit 104. Further, the rotary elevating mechanism 105 moves the lower base unit 104 in the vertical direction to integrally lift the second holding unit 70 and the frame holding unit 80 which are supported by the lower base unit 104.

A peel-off inducing unit 90 is disposed at an outside of the second holding unit 70. The peel-off inducing unit 90 forms a portion which triggers to peel off the supporting substrate S from the substrate W to be processed at a side of the superimposed substrate T.

The peel-off inducing unit 90 includes a sharp member 91, a moving mechanism 92, and an elevating mechanism 93. The sharp member 91 is a flat blade and a tip of the blade is supported by the moving mechanism 92 so as to protrude toward the superimposed substrate T.

The moving mechanism 92 moves the sharp member 91 along a rail which extends in an X axis direction. The elevating mechanism 93 is fixed to the upper base unit 103 and moves the moving mechanism 92 in a vertical direction. By doing this, a height position of the sharp member 91, that is, a contact position with the side of the superimposed substrate T is adjusted.

Such a peel-off inducing unit 90 adjusts the height position of the sharp member 91 using the elevating mechanism 93 and then moves the sharp member 91 in a horizontal direction (in this case, the positive direction of the X axis) using the moving mechanism 92 to bring the sharp member 91 into contact with a side of the supporting substrate S close to the adhesive agent G. Therefore, the portion (hereinafter, referred to as a "peel-off starting portion") which triggers to peel off the supporting substrate S from the substrate W to be processed is formed on the superimposed substrate T.

3. Operation of Peel-Off Apparatus

Figure 11:
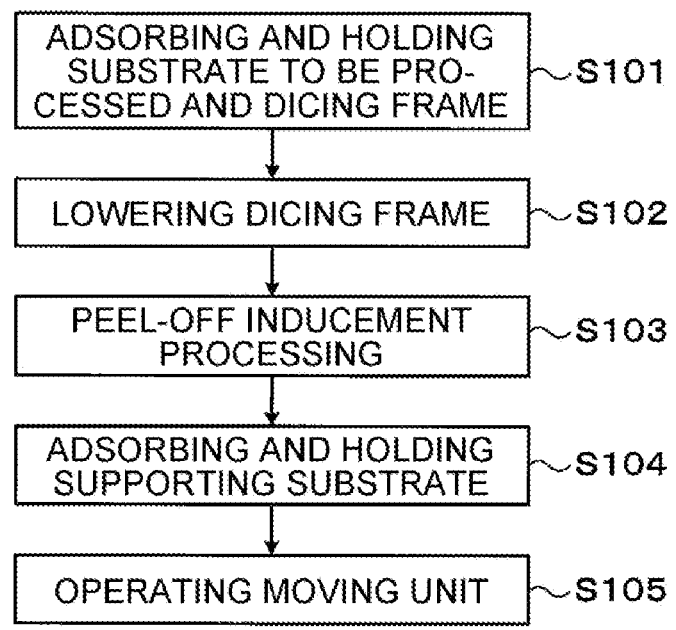
FIG. 11 is a flow chart illustrating a processing sequence of a peel-off processing.

Next, a specific operation of the peel-off apparatus 5 will be described with reference to FIGS. 11 and 12A to 12G. FIG. 11 is a flow chart illustrating a processing sequence of a peel-off processing. Further, FIGS. 12A to 12G are explanatory views of a peel-off operation. Furthermore, the peel-off apparatus 5 performs the processing sequences illustrated in FIG. 11 based on the control of a control device 30.

Figure 12A:
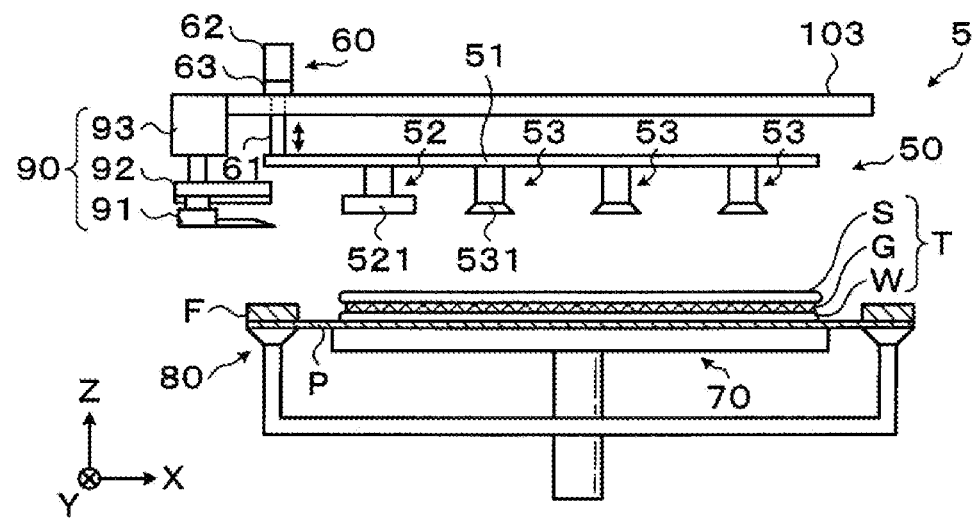
FIG. 12A is an explanatory view of a peel-off operation.
Figure 12B:
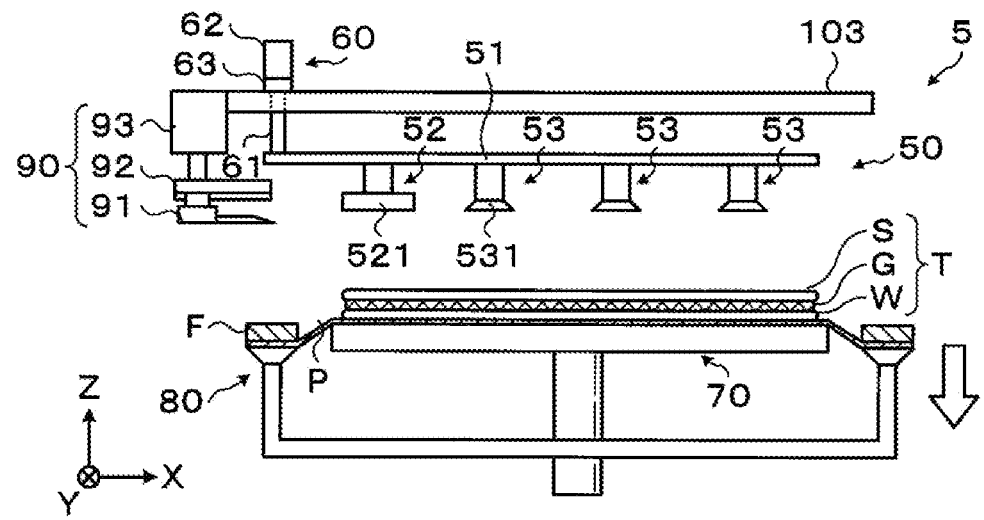
FIG. 12B is an explanatory view of a peel-off operation.
Figure 12C:
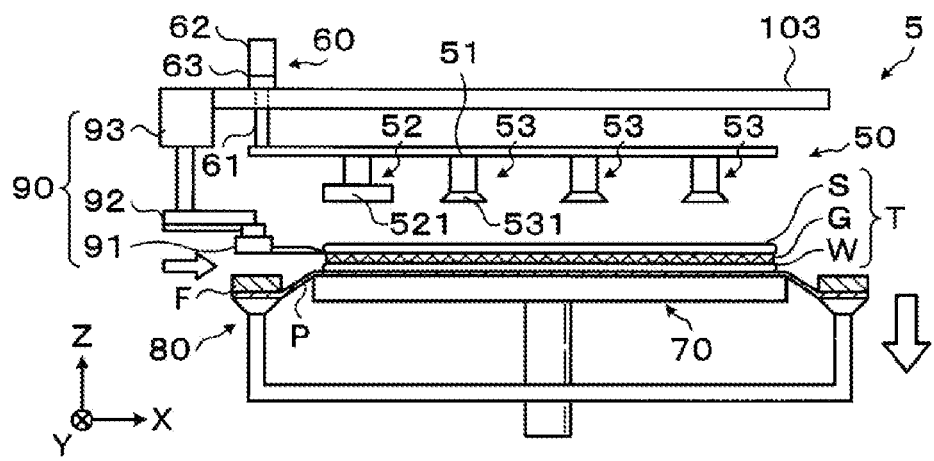
FIG. 12C is an explanatory view of a peel-off operation.

When the superimposed substrate T fixed to the dicing frame F is carried in to the processing chamber 100, the peel-off apparatus 5 adsorbs and holds the side of the superimposed substrate T which faces the substrate W to be processed and the dicing frame F, using the second holding unit 70 and the frame holding unit 80 from the lower side in step S101. In this case, as illustrated in FIG. 12A, the substrate W to be processed and the dicing frame F are supported by the second holding unit 70 and the frame holding unit 80, while the dicing tape P is bonded thereto in a horizontal direction.

Thereafter, the peel-off apparatus 5 adjusts the superimposed substrate T using a position adjusting unit (not illustrated) in a predetermined position. The position adjusting units are provided in positions which are an upper side (for example, the upper base unit 103) of the first holding unit 50 and correspond to three outer peripheral positions of the superimposed substrate T. Each position adjusting unit includes an arm unit which is in contact with the side of the superimposed substrate T which faces the supporting substrate S. The three arm units are brought into contact with the side of the supporting substrate S to center the superimposed substrate T held by the second holding unit 70.

Continuously, the peel-off apparatus 5 lowers the frame holding unit 80 using the moving mechanism 83 (see FIG. 4) of the frame holding unit 80 to lower the dicing frame F which is held by the frame holding unit 80 in step S102. Therefore, a space which advances the sharp member 91 of the peel-off inducing unit 90 toward the superimposed substrate T is secured (see FIG. 12B).

Continuously, the peel-off apparatus 5 performs the peel-off inducement processing using the peel-off inducing unit 90 in step S103. By the peel-off inducement processing, a portion (the peel-off starting portion M) which triggers to peel off the supporting substrate S from the substrate W to be processed is formed in the superimposed substrate T (see, for example, FIG. 12C).

Figure 13A:
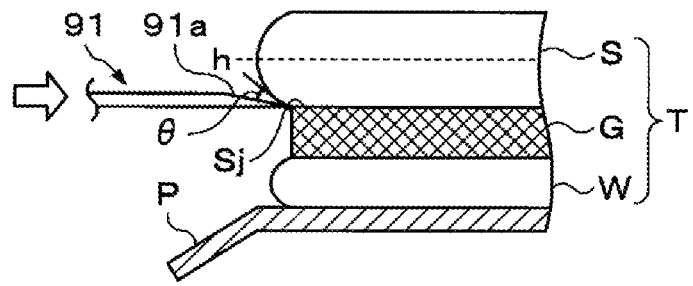
FIG. 13A is an operational explanatory view of a peel-off inducement processing.
Figure 13B:
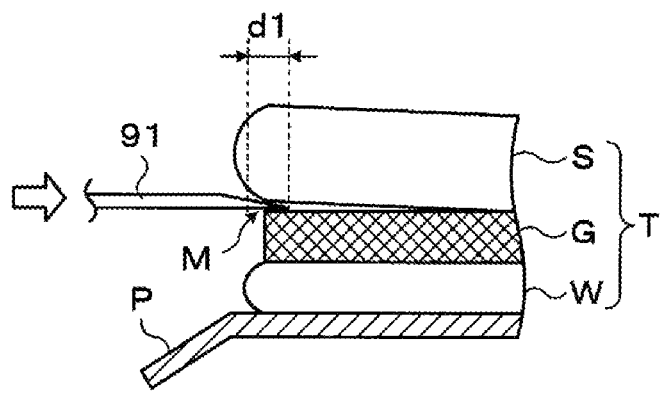
FIG. 13B is an operational explanatory view of a peel-off inducement processing.
Figure 13C:
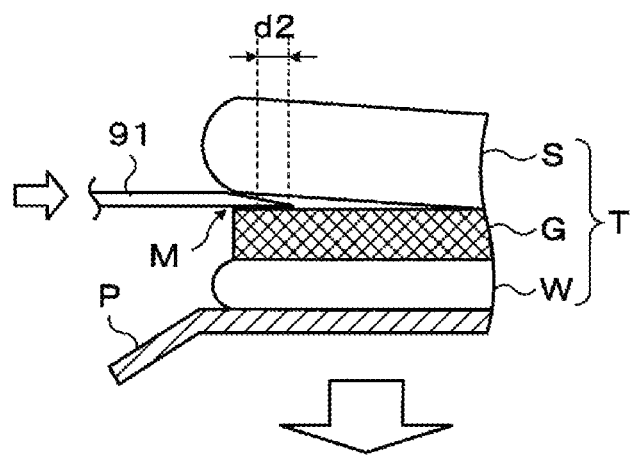
FIG. 13C is an operational explanatory view of a peel-off inducement processing.

Here, the contents of the peel-off inducement processing will be specifically described with reference to FIGS. 13A to 13C. FIGS. 13A to 13C are operational explanatory views of the peel-off inducement processing.

The peel-off inducement processing is performed after holding the substrate W to be processed of the superimposed substrate T by the second holding unit 70 and the dicing frame F by the frame holding unit 80, and before holding the supporting substrate S of the superimposed substrate T by the first holding unit 50. That is, the peel-off inducement processing is performed in a state where the supporting substrate S is free.

The peel-off apparatus 5 moves the sharp member 91 toward the side of the superimposed substrate T using the moving mechanism 92 after adjusting the height position of the sharp member 91 using the elevating mechanism 93 (see FIG. 4). Specifically, as illustrated in FIG. 13A, the sharp member 91 is moved approximately horizontally toward the side of the supporting substrate S close to the adhesive agent G among the sides of the superimposed substrate T.

Here, the "side of the supporting substrate S close to the adhesive agent G" refers to a side which is closer to the bonded surface Sj than a position h corresponding to the half the thickness of the supporting substrate S, among the sides of the supporting substrate S. Specifically, the side of the supporting substrate S is formed to have approximately an arc shape as seen from the cross-section and the "side of the supporting substrate S close to the adhesive agent G" is a side having an angle θ with respect to a slope surface 91a of the blade tip of the sharp member 91 which is 0 degree or larger and 90 degrees or smaller.

The sharp member 91 has a single edged flat blade and supported by the moving mechanism 92 in a state where the slope surface 91a upwardly faces. As described above, the single edged blade whose slope surface 91a faces the supporting substrate S is used as the sharp member 91 so that a load which is applied to the substrate W to be processed when the sharp member 91 enters the superimposed substrate T is suppressed as compared with the case when a double edged blade is used.

The peel-off apparatus 5 advances the sharp member 91 into a predetermined position first (preliminary advancement). Thereafter, the peel-off apparatus 5 further advances the sharp member 91 to bring the sharp member 91 into contact with the side of the supporting substrate S close to the adhesive agent G. Further, for example, a load cell (not illustrated) is provided in the peel-off inducing unit 90, and the peel-off apparatus 5 detects a load applied to the sharp member 91 using the load cell to detect that the sharp member 91 is in contact with the supporting substrate S.

As described above, the side of the supporting substrate S is formed to have approximately an arc shape as seen from the cross-section. Therefore, the sharp member 91 is in contact with the side of the supporting substrate S close to the adhesive agent G so that an upward force is applied to the supporting substrate S.

Subsequently, as illustrated in FIG. 13B, the peel-off apparatus 5 further advances the sharp member 91. Therefore, the supporting substrate S is pushed up along the curve of the side. As a result, a part of the supporting substrate S is peeled off from the adhesive agent G to form a peel-off starting portion M.

Since the supporting substrate S is in a free state without being held by the holding unit 50 yet, the upward movement of the supporting substrate S is not disturbed. In the processing illustrated in FIG. 13B, a distance d1 where the sharp member 91 is advanced is, for example, approximately 2 mm.

The peel-off apparatus 5 may include a checking device (not illustrated) which checks whether the peel-off starting portion M is formed. For example, an infrared (IR) camera which is provided above the supporting substrate S may be used as the checking device.

The reflectivity of the infrared ray varies in portions of the supporting substrate S which is peeled off from the substrate W to be processed and is not peeled off from the substrate W to be processed. Therefore, the supporting substrate S is imaged by the IR camera first to obtain image data in which the difference of the reflectivity of the infrared ray in the supporting substrate S is represented. Such image data is transmitted to the control device 30 and the control device 30 may detect the portion of the supporting substrate S which is peeled off from the substrate W to be processed, that is, the peel-off starting portion M, based on the image data.

When the peel-off starting portion M is detected, the peel-off apparatus 5 proceeds to a subsequent processing which will be described below. In the meantime, when the peel-off starting portion M is not detected by the control device 30, the peel-off apparatus 5 further advances the sharp member 91 or temporarily retracts the sharp member 91 to be separated from the supporting substrate S, and then performs the operations illustrated in FIGS. 13A and 13B again to form the peel-off starting portion M. As described above, the checking device which checks the peel-off state of the supporting substrate S is provided and the peel-off apparatus 5 operates in accordance with the peel-off state to certainly form the peel-off starting portion M.

When the peel-off starting portion M is formed, as illustrated in FIG. 13C, the peel-off apparatus 5 further advances the sharp member 91 while lowering the second holding unit 70 and the frame holding unit 80 using the rotary elevating mechanism 105 (see, for example, FIG. 4). Therefore, a downward force is applied to the substrate W to be processed and the adhesive agent G, and an upward force is applied to the supporting substrate S which is supported by the sharp member 91. By doing this, the peel-off starting portion M is enlarged.

In the processing illustrated in FIG. 13C, a distance d2 where the sharp member 91 is advanced is, for example, approximately 1 mm.

As described above, the peel-off apparatus 5 makes the sharp member 91 with the side of the supporting substrate S close to the adhesive agent G so as to form the peel-off starting portion M which triggers to peel off the supporting substrate S from the substrate W to be processed, at the side of the superimposed substrate T.

The supporting substrate S has a thickness which is approximately 5 to 15 times the thickness of the adhesive agent G. Therefore, as compared with the case when the sharp member 91 is in contact with the adhesive agent G to form the peel-off starting portion, a position of the sharp member 91 in the vertical direction is easily controlled.

The sharp member 91 is in contact with the side of the supporting substrate S close to the adhesive agent G so that a force (that is, an upward force) in a direction where the supporting substrate S is peeled off from the substrate W to be processed may be applied to the supporting substrate S. Further, a portion which is close to the outermost periphery of the supporting substrate S is lifted so that the force in the direction where the supporting substrate S is peeled off from the substrate W to be processed may be efficiently applied to the supporting substrate S.

As compared with the case when the sharp member 91 collides with the adhesive agent G, a possibility that the sharp member 91 is in contact with the substrate W to be processed may be lowered. Therefore, the damage to the substrate W to be processed caused by the sharp member 91 may be prevented.

The "side of the supporting substrate S close to the adhesive agent G" is more desirably a side from the bonded surface Sj of the supporting substrate S to a position corresponding to one quarter of the thickness of the supporting substrate S, that is, a side whose angle θ with respect to the sharp member 91 is 0 degree or larger and 45 degrees or smaller. This is because as the angle θ with respect to the sharp member 91 becomes smaller, the force of lifting the supporting substrate S may be increased.

When an adhesive force between the supporting substrate S and the adhesive agent G is comparatively weak, as illustrated in FIG. 13A, the peel-off starting portion M may be formed only by bringing the sharp member 91 into contact with the side of the supporting substrate S close to the adhesive agent G. In this case, the operations illustrated in FIGS. 13B and 13C will be omitted.

When the adhesive force between the supporting substrate S and the adhesive agent G is comparatively strong, the peel-off apparatus 5 may further rotate the superimposed substrate T around the vertical axis using the rotary elevating mechanism 105 from the state illustrated in FIG. 13C. Therefore, the peel-off starting portion M extends to a circumferential direction of the superimposed substrate T, so that the supporting substrate S may be easily peeled off from the substrate W to be processed.

Figure 14A:
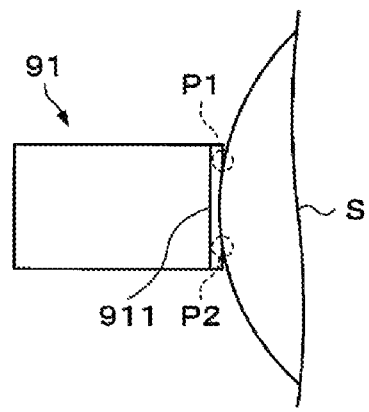
FIG. 14A is a schematic plan view illustrating an example of a shape of a tip of a sharp member.
Figure 14B:
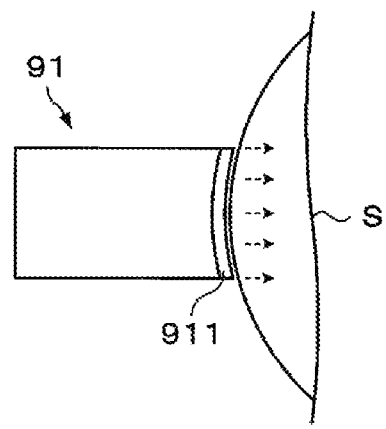
FIG. 14B is a schematic plan view illustrating an example of a shape of a tip of a sharp member.
Figure 14C:
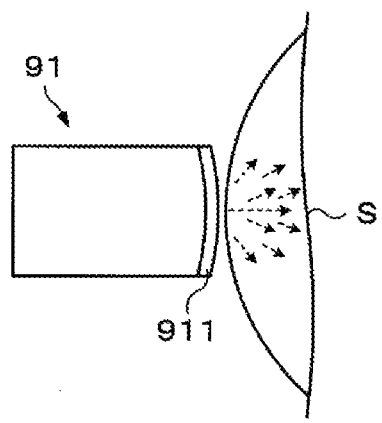
FIG. 14C is a schematic plan view illustrating an example of a shape of a tip of a sharp member.

Here, a shape of a blade tip of the sharp member 91 will be described with reference to FIGS. 14A to 14C. FIGS. 14A to 14C are schematic plan views illustrating an example of a shape of a blade tip of a sharp member 91.

As illustrated in FIG. 14A, the blade tip 911 of the sharp member 91 may be formed to have a linear shape as seen from the plan view. However, as illustrated in FIG. 14A, a periphery of the supporting substrate S (the superimposed substrate T) has an arc shape. Therefore, when the blade tip of the sharp member 91 is formed to have a linear shape as seen from the plan view, a load may be easily concentrated on two points (P1 and P2 of FIG. 14A) of the blade tip which intersect the supporting substrate S as seen from the plan view so that the blade tip may be chipped.

Therefore, as illustrated in FIG. 14B, the blade tip 911 of the sharp member 91 may have a shape which is depressed along the shape of the outer periphery of the supporting substrate S to have an arc shape. By doing this, the entire tip 911 is in uniformly contact with the supporting substrate S, so that the load is prevented from being concentrated on a specific portion of the tip 911.

As illustrated in FIG. 14C, the tip 911 of the sharp member 911 may have a shape such that a center thereof protrudes toward the supporting substrate S to have an arc shape. Therefore, as compared with the tip 911 having the linear shape, more portions of the tip 911 enter into the superimposed substrate T, so that when the upward force is applied to the supporting substrate S, the load which is applied to the sharp member 91 may be received by a larger area, thereby preventing the load from being concentrated.

When the tip 911 is formed to have the shape illustrated in FIG. 14B, the supporting substrate S may uniformly receive the force from the sharp member 91. In the meantime, when the tip 911 has a shape illustrated in FIG. 14C, the supporting substrate S receives force which is distributed from the center of the tip 911 of the sharp member 91 as a starting point.

Figure 12D:
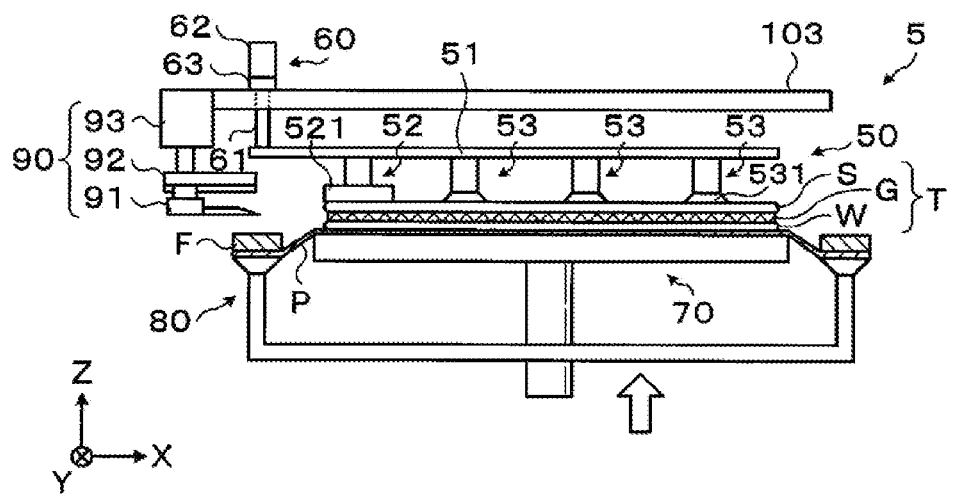
FIG. 12D is an explanatory view of a peel-off operation.
Figure 12E:
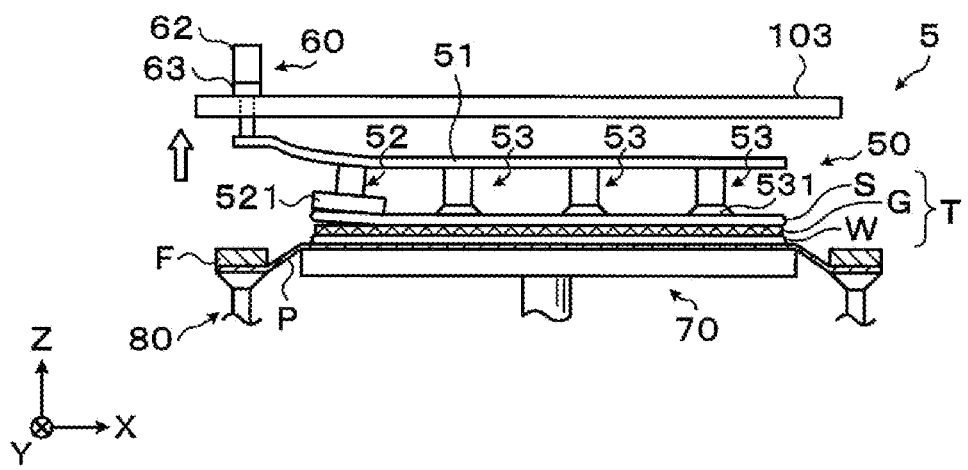
FIG. 12E is an explanatory view of a peel-off operation.
Figure 12F:
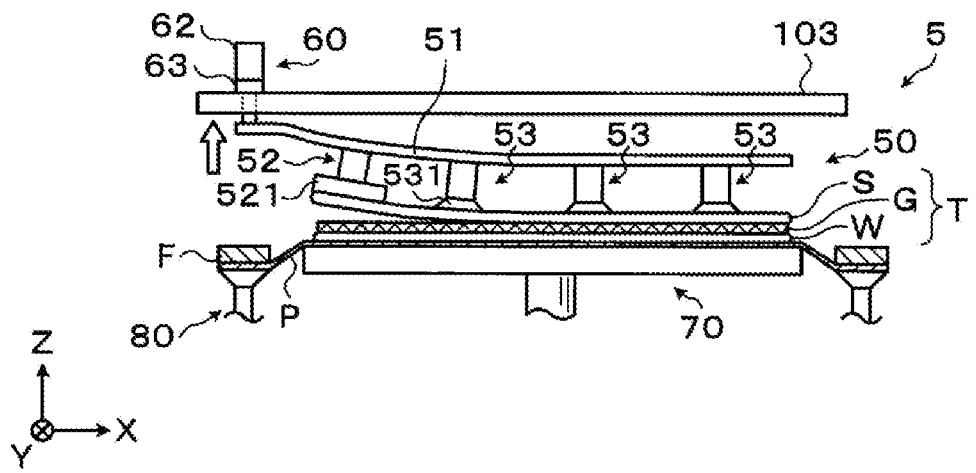
FIG. 12F is an explanatory view of a peel-off operation.
Figure 12G:
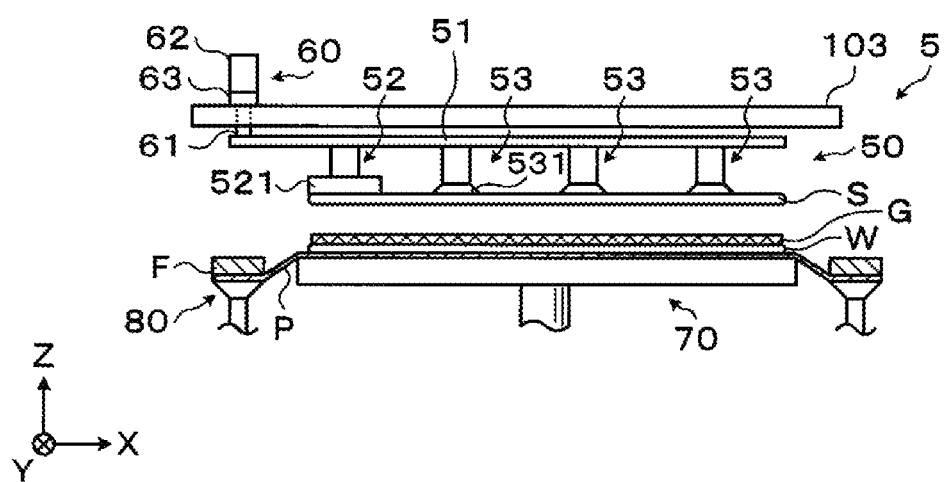
FIG. 12G is an explanatory view of a peel-off operation.

When the peel-off inducement processing in step S103 is completed, the peel-off apparatus 5 lifts the second holding unit 70 and the frame holding unit 80 using the rotary elevating mechanism 105 (see, for example, FIG. 4) to bring the side of the superimposed substrate T which faces the supporting substrate S into contact with the plurality of inner periphery adsorbing units 53 of the first holding unit 50 (see, for example, FIG. 12D). The peel-off apparatus 5 starts an intake operation by the intake device 534 to adsorb and hold the supporting substrate S by the first holding unit 50 in step S104. In this case, the outer periphery adsorbing unit 52 adsorbs the outer periphery of the supporting substrate S which becomes the peel-off beginning point, that is, the peel-off starting portion M and the inner periphery adsorbing unit 53 adsorbs the inner periphery of the supporting substrate S.

Subsequently, the peel-off apparatus 5 operates the moving unit 60 (see FIG. 4) in step S105 to move a part of the outer periphery of the first holding unit 50, specifically, in a direction where the extension unit 512 (see, for example, FIG. 5) of the elastic member 51 is separated from the second holding unit 70. Therefore, the outer periphery adsorbing unit 52 disposed at the earliest peel-off beginning point is pulled so as to start to peel off the supporting substrate S from the substrate W to be processed with the peel-off starting portion M as a beginning point (see, for example, FIG. 12E).

In this case, as described above, the outer periphery adsorbing unit 52 has a double layered structure of the pad member 521 and the support member 522, so that even though the pulling force which acts on the outer periphery adsorbing unit 52 is large, the outer periphery adsorbing unit 52 may appropriately adsorb the outer periphery of the supporting substrate S.

Since the elastic member 51 of the first holding unit 50 has an elastic property, when the moving unit 60 pulls the first holding unit 50, the elastic member 51 is smoothly deformed by the pulling. Therefore, the supporting substrate S may be peeled off from the substrate W to be processed without applying a large load to the substrate W to be processed. Further, the elastic member 51 has flexibility so that a "viscosity" may be added to the force which peels off the supporting substrate S from the substrate W to be processed. Therefore, the supporting substrate S may be efficiently peeled off from the substrate W to be processed.

As described above, the extension unit 512 is provided in the elastic member 51 and the columnar member 61 of the moving unit 60 is connected with the extension unit 512 so that a rotative force (moment) may be added to a force of pulling the supporting substrate S. Therefore, the supporting substrate S is pulled so as to be rolled up from the outer edge so that the supporting substrate S may be efficiently peeled off from the substrate W to be processed.

Thereafter, the peel-off apparatus 5 further pulls up the first holding unit 50 using the moving unit 60. Therefore, the peel-off is continuously performed from an end portion of the supporting substrate S in the negative direction of the X axis to the end portion in the positive direction of the X axis (see, for example, FIG. 12F) and finally, the supporting substrate S is peeled off from the substrate W to be processed (see, for example, FIG. 12G). Next, the peel-off apparatus 5 completes the peel-off processing.

According to the above-described embodiment, the supporting substrate S is adsorbed by the plurality of adsorbing units 52 and 53 of the first holding unit 50 so that the substrate W to be processed is held by the second holding unit 70 while holding the supporting substrate S by the first holding unit 50. In this state, the supporting substrate is moved by the moving unit 60 in a direction where a part of the outer periphery of the first holding unit 50 is separated from the second holding unit 70. By doing this, the outer periphery adsorbing unit 52 which is disposed at the peel-off beginning point is pulled so that the supporting substrate S starts to be peeled off from the substrate W to be processed. In this case, the elastic member 51 of the first holding unit 50 has an elastic property to be smoothly deformed by the pulling which acts on the first holding unit 50. Therefore, the supporting substrate S is pulled so as to be rolled up from the outer periphery without applying a large load to the superimposed substrate T, so that the supporting substrate S may be efficiently peeled off from the substrate W to be processed.

The outer periphery adsorbing unit 52 adsorbs the peel-off starting portion M which triggers the peel-off, so that the peel-off may appropriately start. Accordingly, the supporting substrate S may be efficiently peeled off from the substrate W to be processed.

The outer periphery adsorbing unit 52 of the first holding unit 50 includes the pad member 521 and the support member 522 so that large areas of the adsorbing surfaces 521a and 522a may be ensured and the outer periphery adsorbing unit 52 has a large adsorbing force. Further, when the outer periphery adsorbing unit 52 pulls the supporting substrate S, deformation of the pad member 521 is suppressed by the supporting member 522 having a high hardness while the pad member having an elastic property is in contact with the outer periphery of the supporting substrate S, so that the outer periphery of the supporting substrate S may be adsorbed by the entire surfaces of the adsorbing surfaces 521a and 522a. Therefore, even though a large pulling force is applied to the outer periphery adsorbing unit 52 which is a peel-off beginning point, the outer periphery adsorbing unit 52 may appropriately adsorb the outer periphery of the supporting substrate S.

4. Other Embodiments

In the above embodiments, even though one outer periphery adsorbing unit 52 is provided in the first holding unit 50, a plurality of outer periphery adsorbing units may be provided.

Figure 15A:
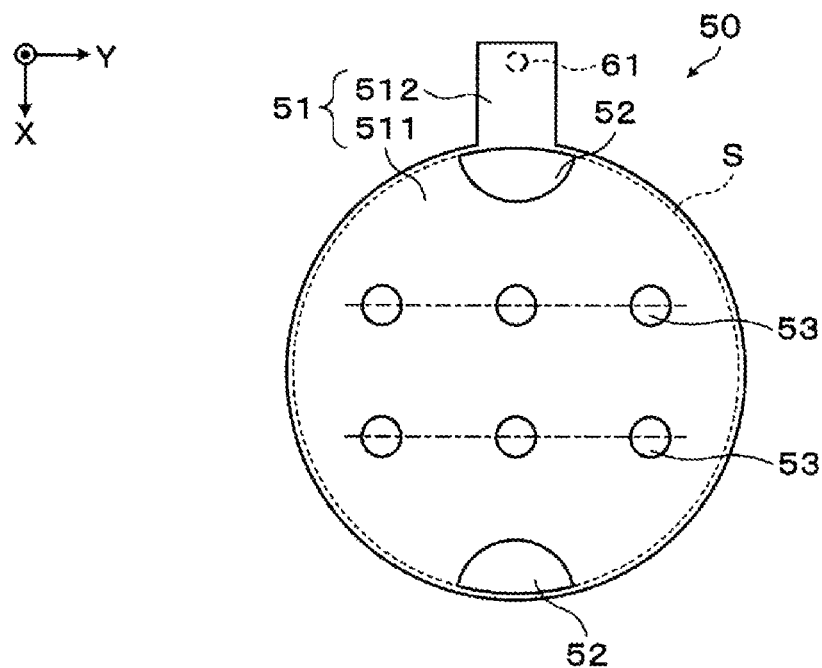
FIG. 15A is a schematic plan view of a first holding unit according to another embodiment.
Figure 15B:
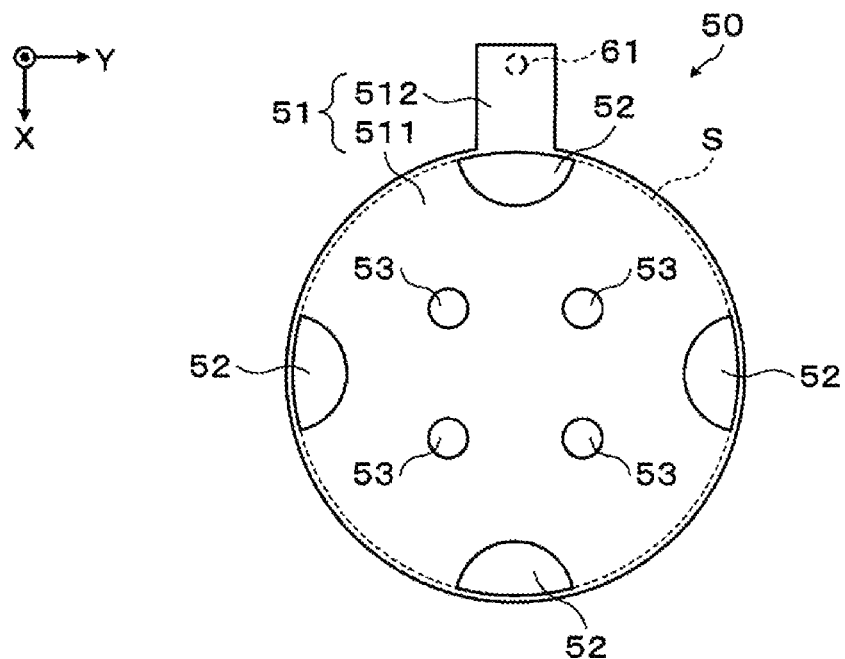
FIG. 15B is a schematic plan view of a first holding unit according to another embodiment.

The number of outer periphery adsorbing units may be arbitrarily determined. For example, as illustrated in FIG. 15A, two outer periphery adsorbing units 52 are provided in a first holding unit 50 and the outer periphery adsorbing units 52 may be disposed in the positive direction and the negative direction of the X axis, respectively. Alternatively, for example, as illustrated in FIG. 15B, four outer periphery adsorbing units 52 are provided in a first holding unit 50 and the outer periphery adsorbing units 52 may be disposed in the positive direction of the X axis, the negative direction of the X axis, the positive direction of the Y axis, and the negative direction of the Y axis, respectively.

As described above, as the plurality of outer periphery adsorbing units 52 is provided, a plurality of moving units 60 and a plurality of peel-off inducing units 90 may be provided in positions corresponding to the outer periphery adsorbing units 52.

In any cases, the outer periphery of the supporting substrate S which is adsorbed by the outer periphery adsorbing unit 52 becomes the peel-off beginning point. Further, the outer periphery of the supporting substrate S which is adsorbed by the outer periphery adsorbing unit 52 is separated from the substrate W to be processed by the moving unit 60. By doing this, the supporting substrate S is peeled off from the substrate W to be processed from the outer periphery of the supporting substrate S to the inner periphery thereof.

According to the present embodiment, a plurality of peel-off beginning points is provided in the supporting substrate S, so that the supporting substrate S is peeled off from the substrate W to be processed in a short time, thereby efficiently performing the peel-off processing.

In the above-described embodiment, an example in which a superimposed substrate to be peeled off is a superimposed substrate T in which the substrate W to be processed and the supporting substrate S are bonded to each other by the adhesive agent G has been described. However, a superimposed substrate which will be peeled off by the peel-off apparatus is not limited to the superimposed substrate T. For example, in the peel-off apparatus 5, in order to form an SOI substrate, a superimposed substrate in which a donor substrate on which an insulating layer is formed and a substrate to be processed are bonded may be a target to be peeled off.

Figure 16A:
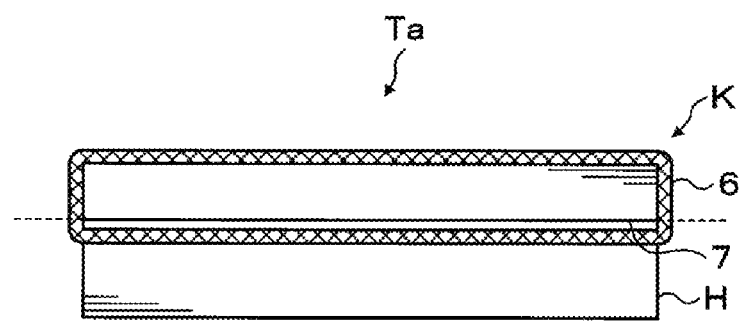
FIG. 16A is a schematic view illustrating a manufacturing process of an SOI substrate.
Figure 16B:
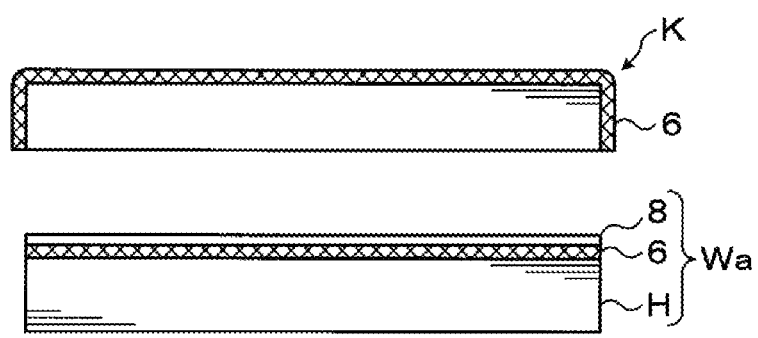
FIG. 16B is a schematic view illustrating a manufacturing process of an SOI substrate.

Here, a manufacturing method of an SOI substrate will be described with reference to FIGS. 16A and 16B. FIGS. 16A and 16B are schematic views illustrating a manufacturing process of an SOI substrate. As illustrated in FIG. 16A, an superimposed substrate Ta for forming an SOI substrate is formed by bonding a donor substrate K and a handle substrate H.

The donor substrate K is a substrate having a surface on which an insulating layer 6 is formed and a hydrogen ion implanted layer 7 is formed in a predetermined depth in the vicinity of a surface which is bonded to the handle substrate H. Further, as for the handle substrate H, for example, a silicon wafer, a glass substrate, and a sapphire substrate may be used.

In the peel off apparatus 5, for example, the donor substrate K is held by the first holding unit 50, the handle substrate H is held by the second holding unit 70, and a part of the outer periphery of the superimposed substrate Ta is pulled by the moving unit 60, so that mechanical impact may be applied to the hydrogen ion implanted layer 7 which is formed on the donor substrate K. Therefore, as illustrated in FIG. 16B, silicon-silicon bonding in the hydrogen ion implanted layer 7 is cut so that a silicon layer 8 is peeled off from the donor substrate K. As a result, the insulating layer 6 and the silicon layer 8 are transferred onto a top surface of the handle substrate H to form an SOI substrate Wa. Further, the handle substrate H may be held by the first holding unit 50 and the donor substrate K may be held by the second holding unit 70.

In the above-described embodiment, even though it is described that the substrate W to be processed and the supporting substrate S are bonded using the adhesive agent G, the bonded surfaces Wj and Sj may be divided into a plurality of areas and adhesive agents having different adhesive forces may be applied in the individual areas.

In the above-described embodiment, even though it is described that the superimposed substrate T is held by the dicing frame F, the superimposed substrate T is not necessarily held by the dicing frame F.

In the above-described embodiment, even though it is described that the sharp member 91 of the peel-off inducing unit 90 is a flat blade, for example, a razor blade, a roller cutter, or an ultrasonic cutter may be used for the sharp member 91.

Even though the embodiment of the present disclosure has been described above with reference to the accompanying drawings, the present disclosure is not limited to the embodiment. It is obvious to those skilled in the art that various changes and modification will be made within the scope of the spirit described in the claims and it is understood by those skilled in the art that the changes and the modification are embraced by the technical range of the present disclosure.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A peel-off apparatus which peels off a superimposed substrate, in which a first substrate and a second substrate are bonded with each other by an adhesive agent, into the first substrate and the second substrate, the peel-off apparatus comprising:

a first holding unit configured to hold the first substrate of the superimposed substrate;

a second holding unit configured to hold the second substrate of the superimposed substrate; and a moving unit configured to move a part of an outer periphery of the first holding unit in order to separate the first holding unit from the second holding unit, wherein the first holding unit includes:

an elastic member of a plate shape connected to the moving unit; and a plurality of adsorbing units provided in the elastic member to adsorb the first substrate, and among the plurality of adsorbing units, an outer periphery adsorbing unit, which adsorbs an outer periphery of the first substrate which becomes a peel-off beginning point, includes:
   a pad member whose adsorbing surface of the first substrate is open to form a hollow portion; and
   a support member which is fitted into the hollow portion of the pad member and has a hardness which is higher than that of the pad member.

2. The peel-off apparatus of claim 1, further comprising:
a peel-off inducing unit configured to form a peel-off starting portion which triggers to peel off the first substrate and the second substrate at a side of one end in the superimposed substrate,
wherein the outer periphery adsorbing unit adsorbs the peel-off starting portion.

3. The peel-off apparatus of claim 1, wherein a portion of the pad member which corresponds to an outer edge of the first substrate is formed to be in contact with the outer edge.

4. The peel-off apparatus of claim 1, wherein a plurality of outer periphery adsorbing units is formed at the outer periphery of the first substrate.

5. The peel-off apparatus of claim 1, wherein the elastic member includes:
   a main body in which the plurality of adsorbing units is provided; and
   an extension unit which is extended from a part of the outer periphery which is disposed at the peel-off beginning point among the outer periphery of the main body in an opposite direction to the peeling-off direction, and
   the moving unit is connected to the extension unit.

6. A peel-off system comprising:
a peel-off apparatus which peels off a superimposed substrate, in which a first substrate and a second substrate are bonded with each other by an adhesive agent, into the first substrate and the second substrate;
a peel-off processing station which includes the peel-off apparatus;
a carrying in/out station in which the superimposed substrate is disposed; and
a substrate conveyance device which conveys the superimposed substrate between the peel-off processing station and the carrying in/out station,
wherein the peel-off apparatus includes:
   a first holding unit configured to hold the first substrate of the superimposed substrate;
   a second holding unit configured to hold the second substrate of the superimposed substrate; and
   a moving unit configured to move a part of an outer periphery of the first holding unit in order to separate the first holdint from the second holding unit,
wherein the first holding unit includes:
an elastic member of a plate shape connected to the moving unit; and
a plurality of adsorbing units provided in the elastic member to adsorb the first substrate, and among the plurality of adsorbing units, an outer periphery adsorbing unit which adsorbs an outer periphery of the first substrate which becomes a peel-off beginning point, includes:
   a pad member whose adsorbing surface of the first substrate is open to form a hollow portion; and
   a support member which is fitted into the hollow portion of the pad member and has a hardness which is higher than that of the pad member.

7. A peel-off method which peels off a superimposed substrate, in which a first substrate and a second substrate are bonded with each other by an adhesive agent, into the first substrate and the second substrate, the method comprising:
   a first holding process in which the first substrate of the superimposed substrate is held by a first holding unit which includes an elastic member of a plate shape and a plurality of adsorbing units which is provided in the elastic member to adsorb the first substrate;
   a second holding process in which the second substrate of the superimposed substrate is held by a second holding unit; and
   a moving process in which a part of an outer periphery of the first holding unit is moved by the moving unit which is connected to the first holding unit in order to separate the first holding unit from the second holding unit,
wherein an outer periphery adsorbing unit among the plurality of adsorbing units includes:
   a pad member whose adsorbing surface of the first substrate is open to form a hollow portion; and
   a support member which is fitted into the hollow portion of the pad member and has a hardness which is higher than that of the pad member, and
wherein, in the moving process, the outer periphery adsorbing unit adsorbs the outer periphery of the first substrate which becomes a peel-off beginning point.

8. The method of claim 7, wherein after the first holding process and the second holding process and before the moving process, a peel-off starting portion which triggers to peel off the first substrate and the second substrate by a peel-off inducing unit is formed at a side of one end of the superimposed substrate, and
   in the moving process, the outer periphery adsorbing unit adsorbs the peel-off starting portion.

9. The method of claim 7, wherein in the moving process, the pad member is in contact with an outer edge of the first substrate.

10. The method of claim 7, wherein a plurality of outer periphery adsorbing units is provided at the outer periphery of the first substrate, and
   in the moving process, the plurality of outer periphery adsorbing units adsorbs the outer periphery of the first substrate which becomes the peel-off beginning point, and
   an outer periphery of the first holding unit which is adsorbed by the plurality of outer periphery adsorbing units is moved by the moving unit to be separated from the second holding unit.

* * * * *